United States Patent [19]
Berg et al.

[11] Patent Number: 5,999,911
[45] Date of Patent: *Dec. 7, 1999

[54] METHOD AND SYSTEM FOR MANAGING WORKFLOW

[75] Inventors: William C. Berg, Beaverton; Darcy J. McCallum, Salem; Reynaldo W. Newman, West Linn, all of Oreg.

[73] Assignee: Mentor Graphics Corporation, Wilsonville, Oreg.

[ * ] Notice: This patent issued on a continued prosecution application filed under 37 CFR 1.53(d), and is subject to the twenty year patent term provisions of 35 U.S.C. 154(a)(2).

[21] Appl. No.: 08/458,188

[22] Filed: Jun. 2, 1995

[51] Int. Cl.⁶ .................................................. G06F 17/60
[52] U.S. Cl. ........................................ 705/9; 705/7; 705/8
[58] Field of Search ................... 364/468.03, 468.05, 364/468.06, 468.15, 474.24; 395/207, 208; 705/9

[56] References Cited

U.S. PATENT DOCUMENTS

| | | | |
|---|---|---|---|
| 5,050,091 | 9/1991 | Rubin | 364/488 |
| 5,208,748 | 5/1993 | Flores et al. | 364/419 |
| 5,208,765 | 5/1993 | Turnbull | 702/84 |
| 5,216,603 | 6/1993 | Flores et al. | 364/419 |
| 5,301,320 | 4/1994 | McAtee et al. | 395/650 |
| 5,423,023 | 6/1995 | Batch et al. | 395/500 |
| 5,826,020 | 10/1998 | Randell | 395/200.32 |

OTHER PUBLICATIONS

Davis, Dwight B., "Software That Makes Your Work Flow," *Datamation*, Apr. 15, 1991, pp. 75–76, 78.

Medina–Mora, et al., "Workflow Management Technology: Examples, Implementations and New Directions," *ACM SIGCHI/SIGOIS Proc of the Conference on Computer Supported Cooperative Work*, Nov. 1992, pp. 281–288.

Greif, Irene, "Desktop Agents in Group–Enabled Products," *Communications of the ACM*, Jul. 1994, pp. 100–105.

"XSoft Offers Workflow Management Software", The Seybold Report on Publishing Systems, vol. 22, No. 12, Mar. 8, 1993, Seybold Publications, Inc., pp. 1–4.

"Adaptive Workflow Software for Continuous Process Improvement", InConcert Programming Guide, Xerox Corporation, 1995, pp. 1–1 –2–10.

"Action Workflow Analyst", "Action Workflow Builder", "Action Workflow Manager", and "Action Workflow DocRoute", brochures from Action Technologies, Inc., 1993–94.

"Workflow Management: Document–Based Workflow Management Software by Xerox: XSoft", Edge Work–Group Computing Report, v 4, n 146, Mar. 8, 1993.

"XSoft Offers Workflow Management Software", Seybold Report on Publishing Systems, v 22, n 12, pp. 1–4, Mar. 8, 1993.

*Primary Examiner*—Edward R. Cosimano
*Assistant Examiner*—Alexander Kalinowski
*Attorney, Agent, or Firm*—Klarquist Sparkman Campbell Leigh & Whinston LLP

[57] ABSTRACT

A workflow manager system provides computer-assisted, graphical tools for defining and managing complex processes in terms of a workflow. A workflow includes a number of steps having step encapsulations and dependency relationships. Step encapsulations define the work to be performed by a step in a work flow such as launching a design tool. The dependency relationships represent the conditions that must be satisfied before a step can be performed and can be expressed in terms of boolean relationships using step and data states or data values as arguments. The workflow system manages the state of a workflow including the state of steps and data, and makes the workflow and its related data accessible to multiple users.

35 Claims, 14 Drawing Sheets multi-instance SubFlow Information

Step Name : my_flow1
State : IP
Current Instances :

| name | state | user | comments |
|------|-------|------|----------|
| SIM1 | IP | U1 | first simulation |
| SIM2 | CS | U2 | second simulation |
| SIM4 | IP | U2 | xxx simulation |

| New Instance | Continue Instance | Info | Delete |

402  404  406  408
400

INSTANCES :
- INSTANCE 1
- INSTANCE 2
- INSTANCE 3

410

412

METHOD AND SYSTEM FOR MANAGING WORKFLOW

TECHNICAL FIELD

The invention generally relates to computer aided design and more specifically, relates to a system for managing complex design processes.

BACKGROUND OF THE INVENTION

As the speed, and capacity of computers has increased, engineers and developers have relied more frequently on computer based tools to assist them in solving a wide range of problems. In the design automation field, computers are effective tools for organizing complex data, performing complex computations, and representing design data in easily understood formats.

The electronic design automation (EDA) field has produced a number of computer-based design tools to assist in the development of complex electronics. To list a few examples, there are computer-based tools to synthesize, simulate, and test an electronic circuit design. These tools have enabled design teams to decrease significantly the design cycle for complex electrical components.

Even with the array of design tools available to assist the design team, the design problem is still very difficult to manage. Many of today's computerbased design tools only assist in a single step in the design process such as helping design the physical layout of components on a circuit board or simulating the behavior of a circuit design. In most electronic design problems however, there are a number of steps, each potentially involving a number of designers and a large amount of data. In this complex design environment, it is very difficult to track the design steps and to organize the design data generated from those steps. Thus, while today's design tools help developers and engineers perform their design tasks, they do not adequately address the issue of managing the design process as a whole.

Groupware presents an alternative solution for helping designers manage shared data relating to a design problem. Groupware products facilitate the sharing of information in the form of documents among members of an organization. They enable users of computers in a network to edit and view information stored in shared documents.

Though effective at maintaining shared information, current groupware tools do not guide designers through related process steps. Groupware does not allow a designer to define a model for an arbitrary process. More specifically, groupware does not allow a user to describe steps in the process and the dependencies among these steps. In a typical design process, there are a number of steps which must be performed in a particular order. As designers perform these steps, they create or transform design data. Groupware cannot effectively model a design process because it cannot model the dependency among steps, and it cannot manage the creation and transformation of data from process steps.

Apart from groupware, a number of computerbased tools in the EDA marketplace purportedly address the concept of a design process. These design tools fall into one of the following categories: (1) Tool Launchers; (2) Tool Sequencers; and (3) Flow Sequencers.

Tool launchers are understood to provide nothing more than a centralized location for invoking other computer-based design programs.

Slightly more effective than tool launchers, tool sequencers control the order in which a user can invoke a design tool. Tool sequencers, however, are typically only single user tools, designed mainly to guide novice users through a tool set.

Flow sequencers provide a very basic capability to define a dependency between steps in a process. This capability is rather limited, however. Typically, a parent step must complete before a child step can start.

Existing computer-based tools that fall in the above categories suffer from a number of additional drawbacks making them unsuitable for managing complex design processes. Many of these tools are single user tools, which limits their utility in the typical design team environment. These tools fail to allow users to define and modify arbitrary and sufficiently robust models or "templates" of design processes. As such, they provide no means for managing the dependency relationship among steps, or the underlying design data created or transformed during a design step. Finally, existing tools or design tool frameworks known to the inventor are not based on an open architecture, but rather, rely on certain proprietary features of their environment. Therefore, they are incompatible with a number of other computer based tools.

In light of the various deficiencies of existing design tools, there is substantial need for an improved computer-based tool for defining and managing complex processes.

SUMMARY OF THE INVENTION

To address the drawbacks and limitations of existing systems, the invention provides a method and system for managing workflows. In one specific embodiment of the invention, a workflow manager system is implemented in a computer with a graphical user interface. The system enables a user to define a process, such as an electronic circuit design process, in terms of a workflow. The workflow definition includes a description of the steps in the process, the dependency relationship among steps, and the work to be performed by each step in terms of a step encapsulation. While one or more users perform a design process, the workflow manager system manages the process according to a workflow definition.

The workflow manager system according to the embodiment controls the execution of steps in a workflow. When the system receives a request to execute a step, the system determines whether the step can be executed based on the dependency relationship in the workflow definition. The system can invoke another program to perform work by applying the step encapsulation associated with the step. The system manages the workflow by maintaining state of the steps and design data in the workflow and displaying this state to the user or users of the system.

A system designed according to the invention has a number of advantages over existing design tools. The system enables users to capture, edit, and re-use instances of a workflow. To accurately model a process, the system allows a user to define a process in terms of a workflow adhering to a flow diagram paradigm. In this environment, the user can define complex relationships among steps and data. The design group and project manager can track the status of the project through step and data state information, which can be represented graphically on a display or placed in a report. The project manager can even track the history of the design process.

The system helps one or more users work on a complex design problem without requiring each user to know the details of each step in the process. The workflow model is easy to understand. The step encapsulations defined for each step allow the system to invoke and communicate with a wide variety of different programs without requiring the designers to be familiar with nuances in launching or controlling design tools used in a design process. The workflow manager can report the state of steps in a graphical and readily understood fashion through the graphical display of the workflow. This is only a brief listing of some of the advantages provided by a system designed according to the invention.

Further advantages and features of the invention will become apparent from the following description and accompanying drawings.

DETAILED DESCRIPTION

Figure 1:
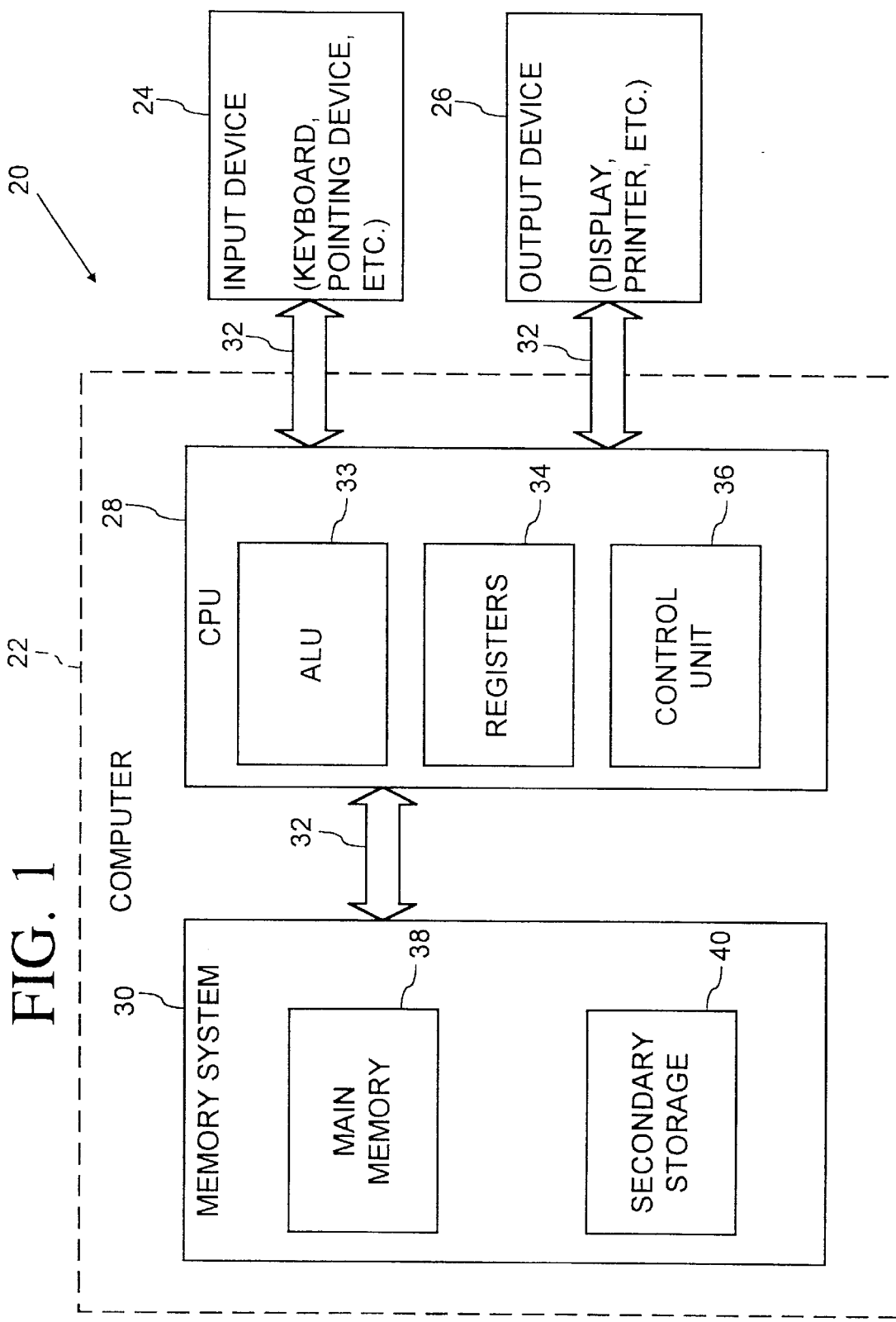
FIG. 1 is a block diagram of a computer system which is used to implement a method and system embodying the invention.

The invention provides a computer-based method and system for managing a workflow. For clarity, we refer to the system as a workflow manager system. We begin with a definition of a workflow in the context of the invention. Next, we provide a description of the computer system in which the invention can be implemented. After describing the computer system, we describe the system architecture of an embodiment of the workflow manager system. Finally, we describe the operation of the workflow manager system.

A workflow is a description of a process in terms of the steps or tasks that comprise the process. Like a flow diagram, a workflow describes the steps in a process and the dependency among steps. Each step is a task to be performed in the process. A workflow definition can include a description of the desired behavior that occurs when a step is executed and a description of step dependencies in terms of steps and data. A step dependency can include a dependency on the state of one or more steps and/or the state or value of one or more data variables.

The system enables a user to interactively create a workflow definition, including a graphical description of the workflow as well as a description of work performed by steps in the workflow and dependency among those steps. The graphical description of a workflow is based on a flow diagram paradigm where graphical representations of step types and flow lines illustrate the process. While creating a graphical description of the workflow, the user specifies the workflow definition in terms of dependency relationships. The workflow definition, including the graphical representation of the workflow and the dependency relationships, is referred to as a "template." After the workflow definition is created, users of the system can then use an instance of the workflow as a guide to interactively perform a process.

When a user opens an instance of a workflow, the workflow manager system displays the workflow and guides the user through it. In the case of multiple users, the workflow manager system can be implemented in a network configuration enabling each user to access and interact with a shared instance of a workflow. The workflow manager system enforces the dependencies among steps and data based on the workflow definition. As steps are performed, the system maintains and graphically depicts the state of steps and data in the process. The system also maintains historical and statistical data about the process.

In one embodiment of the workflow manager system, a step encapsulation describes the behavior that occurs when a step is executed. Step encapsulations can be described in a variety of ways, such as using UNIX shell languages, standard programming languages such as C, or extension languages such as AMPLE from Mentor Graphics Corporation. The step encapsulation typically describes how to launch a program to perform a step. Step encapsulation is described in further detail below.

In addition to step encapsulations, a workflow definition describes dependencies among the steps in a process. These dependencies can include dependencies among steps based on the state of another step such as whether another step has been performed successfully or is currently being performed. The dependency can also be based on the state of data, such as whether data is ready to be used as input to a step, or whether the value of a specified data variable calculated during a step has a pre-defined value.

Having generally described the concept of a workflow in the context of a workflow manager system, we now describe details of how to implement an embodiment of the invention. FIG. 1 is a block diagram of a computer system 20 which is used to implement a method and system embodying the invention. Computer system 20 includes as its basic elements a computer 22, input device 24 and output device 26.

Computer 22 generally includes a central processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices and secondary storage 40 in the form of a medium such as floppy disks, hard disks, tape, CD-ROM, etc. and other devices that use electrical, magnetic, optical or other recording material. Main memory 38 stores programs such as a computer's operating system and currently running application programs. Main memory 38 also includes video display memory for displaying images through a display device.

Input device 24 and output device 26 are typically peripheral devices connected by bus structure 32 to computer 22. Input device 24 may be a keyboard, modem pointing device, pen, or other device for providing input data to the computer. Output device 26 may be a display device, modem, printer, sound device or other device for providing output data from the computer.

In accordance with the practices of persons skilled in the art of computer programming, the present invention is described below with reference to symbolic representations of instructions that are performed by a computer system 20 or a network of computers. These instructions are sometimes referred to as being computer-executed. An embodiment of the invention can be implemented as one or more programs, comprising a series of instructions stored on a computer readable medium. The computer readable medium can be any of the devices, or a combination of the devices, described above in connection with memory system 30. For example, a program or programs for implementing the invention can be stored in secondary storage including, but not limited to, a diskette, hard drive, or CD-ROM. In addition, one or more programs can be stored in main memory of a computer system or a number of computer systems coupled via a communication link such as a computer network, or telephone connection.

It will be appreciated that the instructions which are symbolically represented include the manipulation by CPU 22 of electrical signals representing data bits and the maintenance of data bits at memory locations in main memory 26 or secondary memory 28, as well as other processing of signals. The memory locations where data bits are maintained are physical locations that have particular electrical, magnetic, or optical properties corresponding to the data bits.

It should be understood that FIG. 1 is a block diagram illustrating the basic elements of a computer system; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which one or more of these parts of the CPU are integrated together, such as in a microprocessor. Moreover, the number and arrangement of the elements of the computer system may be varied from what is shown and described in ways known in the art.

The workflow manager system may be implemented in any of a number of well-known computer systems. A workflow manager system according to an embodiment of the invention is ported to Sun Workstations for the Sun OS and Solaris Operating Systems, and to the Hewlett-Packard PA-RISC workstation. In addition, to these specific platforms, the workflow manager system can be ported to a variety of UNIX workstations. Similarly, it can be ported to personal computers (PC), such as IBM-AT compatible computers or computer systems based on the 80386, 80486, or Pentium processors from Intel Corporation. The above systems serve as examples only and should not be construed as limiting the type of computer system in which the invention may be implemented.

An operating system, loaded into memory of the computer system, provides a number of low level functions to support the operation of an embodiment of the invention. In general, the operating system is responsible for controlling the allocation and usage of a hardware resources such as memory, CPU time, disk space, and peripheral devices. As is well-known, operating systems provide such low level functions as module (process and dynamic link library) management, scheduling, interprocess messaging, memory management, file system management, and graphical user interface support. An operating system, such as UNIX, also supports network communication, including Remote Procedure Calls (RPC).

Figure 2:
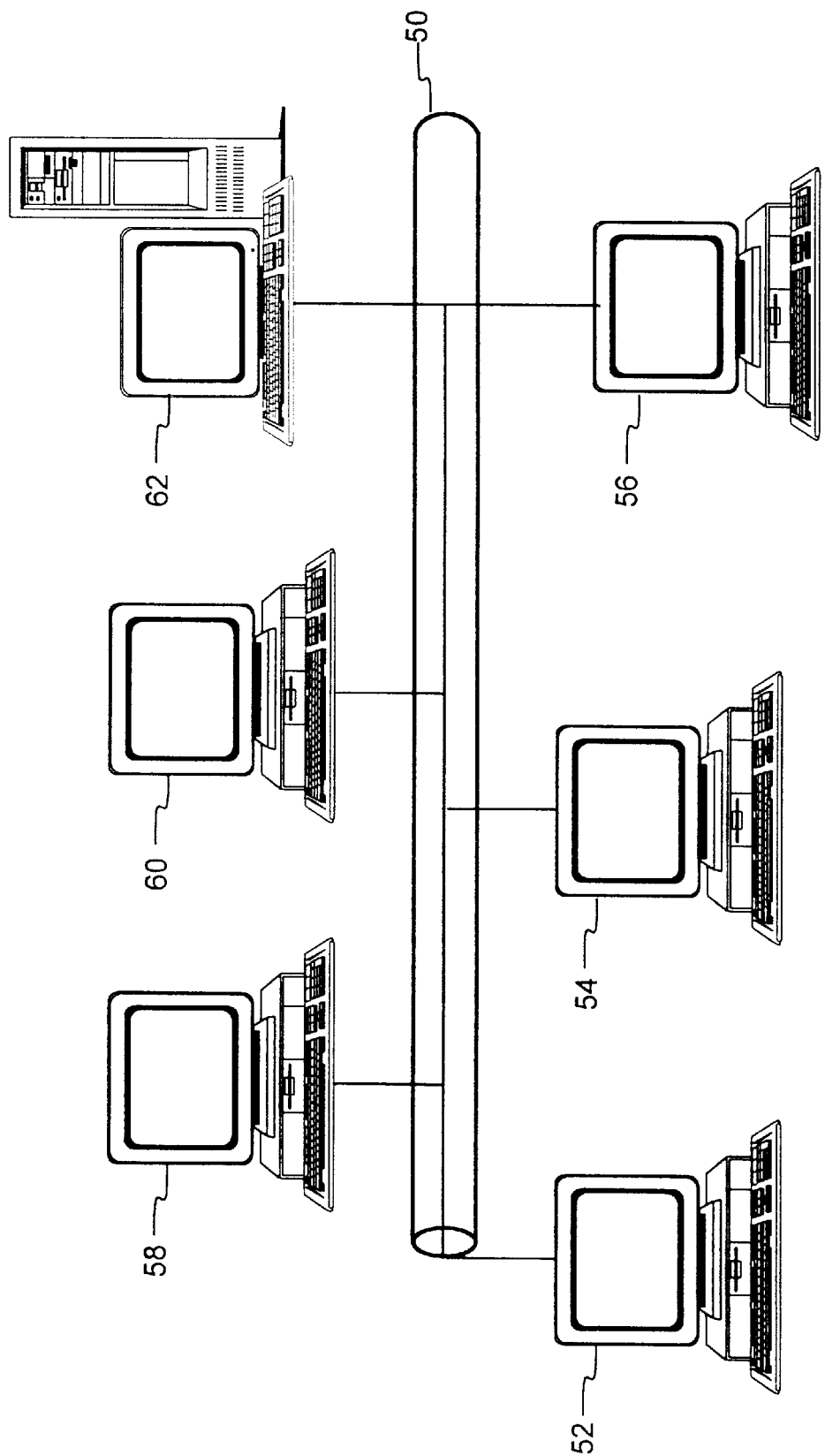
FIG. 2 represents an example of a computer network configuration in which an embodiment of the invention can be implemented.

FIG. 2 represents an example of a computer network configuration in which an embodiment of the invention can be implemented. The example network is an ethernet network 50 of Sun workstations 52–60 and a server 62 running the Sun OS 4.1.3 operating system. This particular example illustrates a standard Ethernet Local Area Network (LAN) 50 adhering to the IEEE 802.3 standard. Each computer system has a basic architecture as illustrated in FIG. 1. In addition, each computer includes a network interface including a network adapter card and a network operating system to support network communication. Any or all of the computers can support a workflow manager system.

Figure 3:
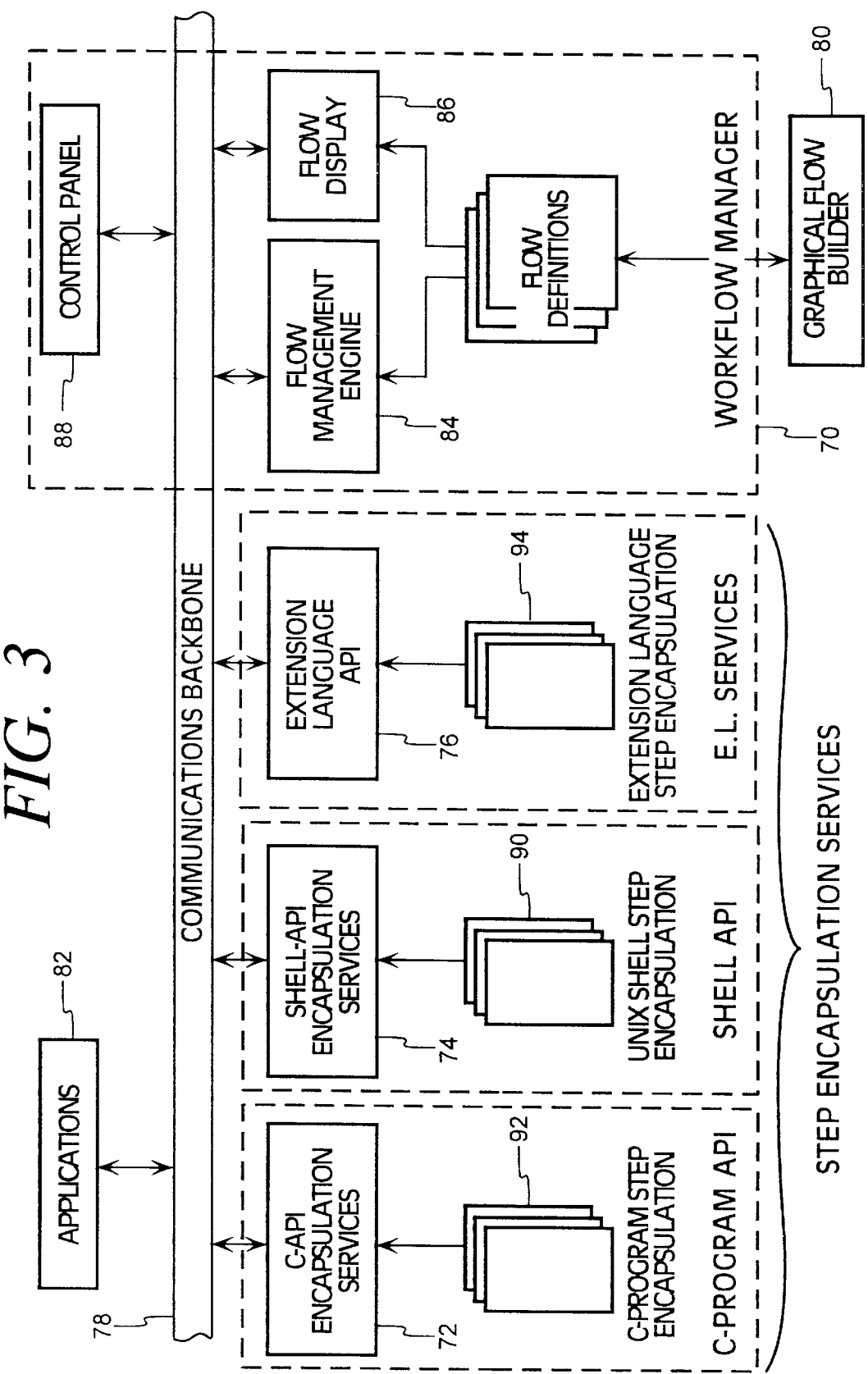
FIG. 3 illustrates the architecture of a workflow management system according to an embodiment of the invention.

FIG. 3 illustrates the architecture of a workflow management system according to an embodiment of the invention. The illustrated workflow manager system includes a workflow manager 70, one or more step encapsulation services 72, 74, 76, a communications backbone 78 and a graphical flow builder 80. The workflow manager includes a flow management engine 84, one or more flow displays 86, and a control panel 88. Through the communications backbone, the workflow manager can communicate with applications 82 such as design tools, data management tools, project management tools, etc.

The flow management engine 84 manages workflow definitions. In this embodiment, the workflow definition is called a template or flow template. The flow template is comprised of graphics and actions describing the steps in a workflow. The graphics include pictures or icons that represent steps, decision branches, relation lines, color of text, and other graphical attributes of a workflow. An action is the work performed when a step is executed, and is defined in terms of a step encapsulation. In addition to an action, a step can be associated with a dependency expression to describe the dependencies for the step.

Before using a template, the template is instantiated. "Instantiated" means creating a working copy from a flow template. To create an instance, a designer, typically the project leader, gives a template a specific name and specifies a directory where the instance is to be stored. Information about the workflow and the state of steps and data in the flow are kept in this directory.

The flow management engine manages an instance of a template by maintaining a workflow instance database. The workflow instance database includes a number of files for storing information about an instance of a workflow. These files include one or more state files to maintain step and data state variables, one or more log files to track users of an instance, and a history file to keep a time-stamped record of when actions occurred.

Every time an event occurs in a workflow instance, the flow management engine records the event in one of these files. For each step in a flow, the flow management engine keeps track of the identification, e.g. login name, of a user executing the step, the name of the step, the time and date step execution started and ended, number of iterations through the step, time constraint violations if any, tool invocation command string if possible, state of the step after execution, the file pathname for tool execution logs, if possible, and the data used by the step. For a workflow, the flow management engine maintains the identification, e.g. login name, of the user who opened the workflow, the time and date the session started, the time and date the session ended, and the status of the workflow instance when opened or user session started, and status of the workflow instance when closed or user session ended.

The illustrated workflow manager system provides a graphical windowing environment. In this embodiment, the windowing environment is implemented with X Motif graphical user interface tools from IXI of Santa Cruz, Calif., but it can also be implemented using a variety of other alternative graphical user interface tool kits. X Motif is a standard windowing environment that defines the look and feel of standard graphical constructs such as a window, dialog box, etc. The graphical interface tools from IXI adhere to this standard and provide a library of functions and the programming interface to these functions to support the X Motif standard graphical constructs.

The workflow manager system employs both standard and custom graphical constructs. The standard constructs are predefined elements of the X Motif environment including windows, dialog box, scroll bars etc. The X Motif environment also supports the creation of custom user interface controls called gadget controls. In this embodiment, gadgets were developed to represent a variety of step types, e.g. task, decision, and subflow steps in the workflow.

A flow display is a window providing a graphical view of a workflow. If a workflow has one or more subflows, each of these subflows has its own flow display. The flow display sends the user inputs to the flow management engine, which then processes those inputs. Once the processing is complete, the flow management engine instructs the flow display to update its display.

The flow management engine communicates with the user through one or more flow displays. The flow management engine receives input from a user through the flow display, and performs actions in response to this user input. The flow management engine is responsible for maintaining and updating the state of a workflow and communicating any change in the state of the workflow to other workflow manager systems operating on the same workflow. By updating the state of the workflow instance in this manner, all users working on the same instance of a workflow share the same view of the workflow.

Concurrent access to the workflow instance database is supported by means of lock files. The workflow managers running on various nodes in a network access the workflow instance database by using the directory path to its location on the network. In a UNIX based network, the location of the flow instance can be any node in the network, whether it is a file server or a workstation. When a workflow manager system is writing to a file, the system has a lock to the file. Before writing to a file, the workflow manager first checks whether there is a lock on a file. If there is a lock on the file, the workflow manager waits until it receives a lock and then writes to the file. Using these lock files, a number of users are able to share access to a workflow instance.

A user can have a number of flow displays open at once. When a workflow instance includes subflows, the user can open flow displays for the parent workflow as well as the subflows. The user can also open flow displays from separate workflow instances at the same time.

To process input for a number of open flow displays, the workflow manager system implements an input event loop. The workflow manager cycles through this event loop to process user input from open flow displays. For example, when a user clicks on a task step with a mouse, the mouse generates an input event. The workflow manager processes this event by calling a function or functions in the flow management engine.

The communications backbone enables processes in a workflow manager system to communicate. In this embodiment, the communications backbone is based on remote procedure calls (RPC) and ToolTalk, both standard and readily available communication technologies.

The control panel 88 is a user interface construct enabling the user to select among a number of high level options. The control panel includes New, Open, Reports, Help, and Exit buttons. When the user presses the New button, the system launches a flow builder to create a new workflow. The Open button enables the user to open an existing workflow. The Reports button launches a feature to generate reports from data stored during execution of a workflow or several workflows. Finally, Help and Exit are standard commands to get help and exit the program, respectively.

The architecture of the workflow manager system includes one or more services to support the programming of step encapsulations. FIG. 3 illustrates a number of examples of step encapsulation services 72–76 compatible with the system architecture. In the workflow manager system depicted in FIG. 3, a step encapsulation can be written in a shell script 90, a C program 92, or as an extension language function such as an AMPLE function 94. AMPLE is an extension language designed for the Falcon Framework available from Mentor Graphics Corporation.

The workflow manager system provides an application programming interface (API) to support access from a step encapsulation program to workflow information and workflow control. For a step encapsulation written in AMPLE, each function in the API has a corresponding AMPLE builtin. AMPLE builtins declare their arguments as strings. The AMPLE builtins return values of AMPLE data type string. For a step encapsulation written in a shell script, shell calls to the API include a command to communicate with the workflow manager API. This command parses the command line, calls the API functions, and passes arguments to the API function. For a step encapsulation written in C, the C program is compiled with the API header file, and linked with an object library of the API functions. When used to perform work in the workflow, the C program is invoked from the shell.

Referring again to FIG. 3, the workflow manager system includes a graphical flow builder 80 and flow definition language to enable a user to define and store a model of a process. The flow builder 80 provides a "drag and drop" environment for modeling a process in terms of a workflow.

Figure 4:
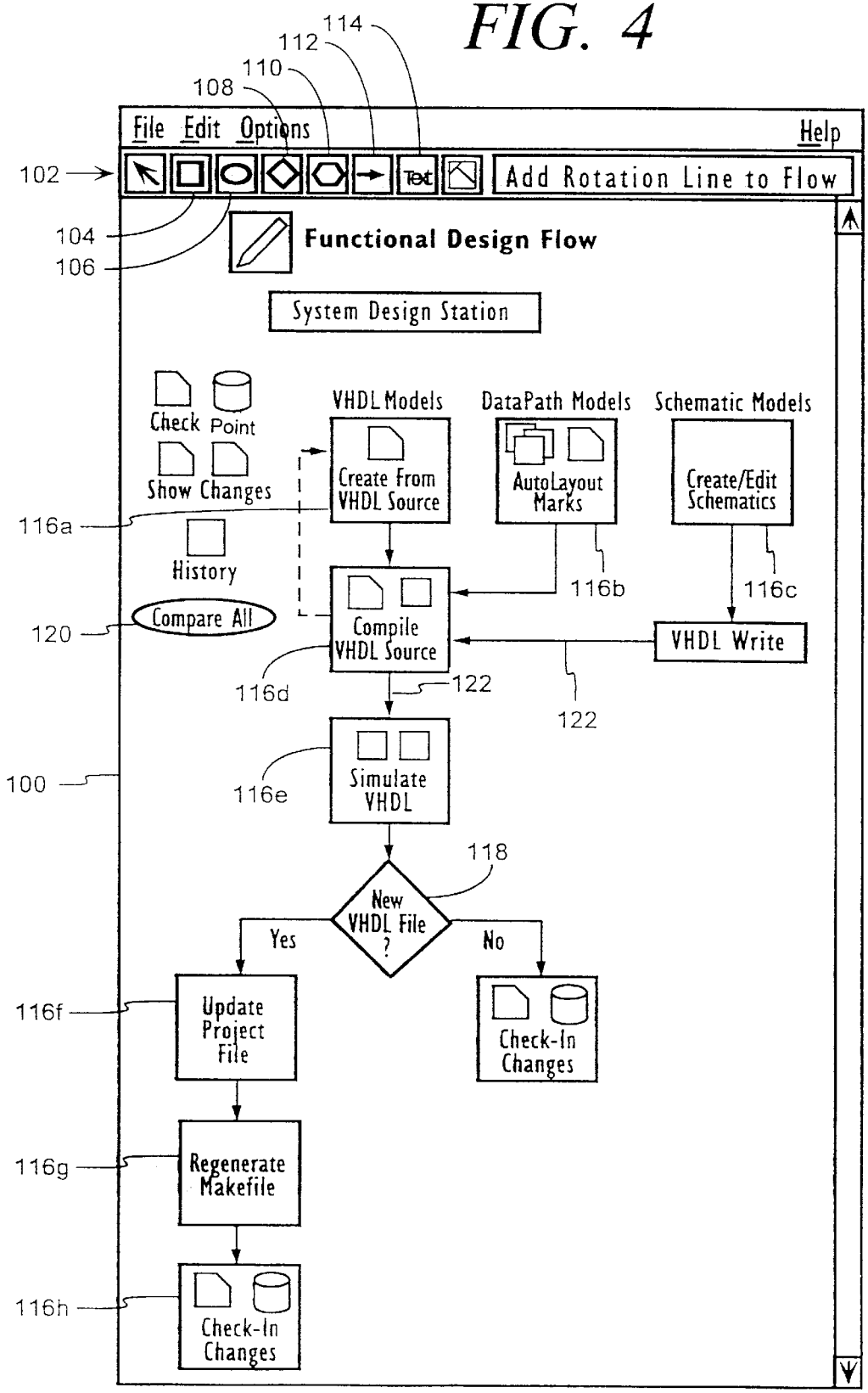
FIG. 4 illustrates a window of a graphic flow builder according to an embodiment of the invention.

The flow builder 80 presents windows to describe the basic attributes of steps in a workflow, define the appearance of the workflow, and specify actions for the steps in the workflow in terms of step encapsulations. FIG. 4 illustrates a user interface window 100 of the flow builder. A series of icons 102 appear across the upper portion of the window. To create a step, the designer can select one of the step icons, which include a task step 104, an activity step 106, a decision step 108, and a subflow step 110. There are additional icons to create relation lines (112) and add text (114). To build a workflow, the designer can "drag and drop" selected graphics into the window area. In this example, the window includes several task steps 116a–h, a decision step 118, an activity step 120, and relation lines 122 connecting the steps.

Figure 5:
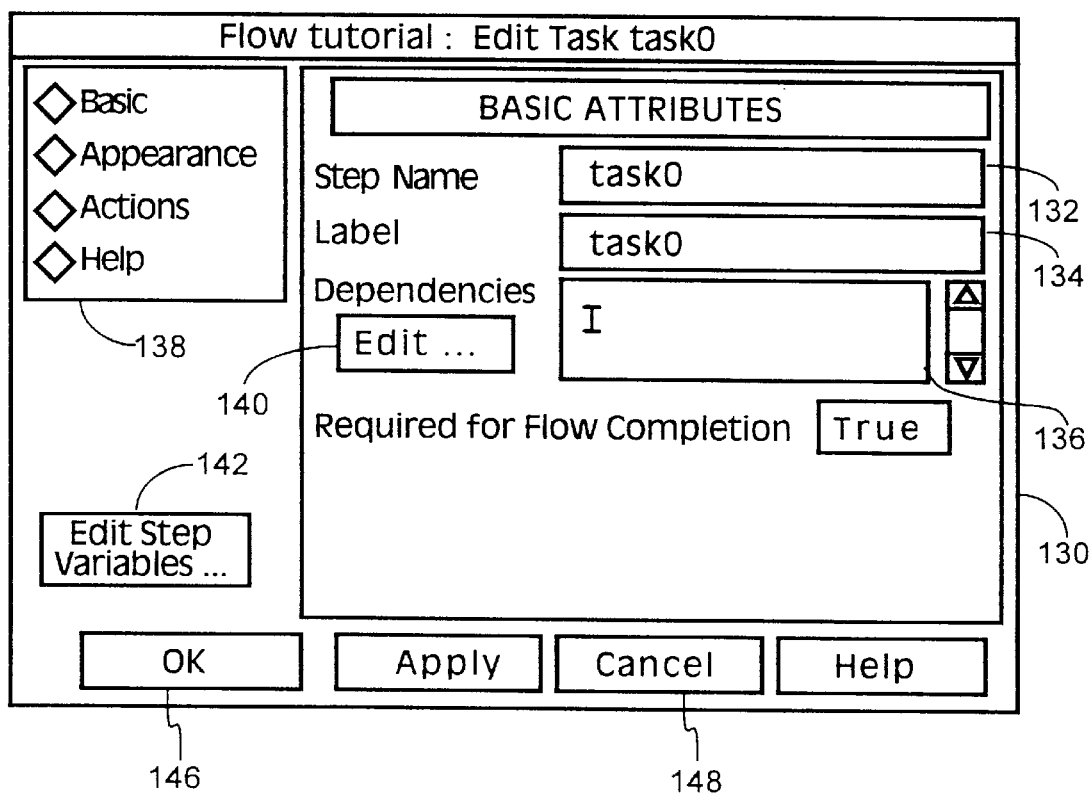
FIG. 5 illustrates another window of the graphic flow builder according to an embodiment of the invention.

When the designer clicks on a graphic representing a step in the flow builder, the flow builder displays a "BASIC ATTRIBUTES" dialog box as shown in FIG. 5. The dialog box includes a number of edit boxes 132–136 allowing the designer to specify the step name (132), step label (134), and step dependencies (136) for a step. This dialog box 130 also includes a series of push button controls 138 ("Basic", "Appearance", "Actions", and "Help") that enable the designer to choose among dialog boxes for a particular step. The designer can edit existing dependency expressions by clicking on the "Edit . . . " button 140. To further edit step variables, the designer can click on the "Edit Step Variables . . . " button 142, which causes the flow builder to display yet another dialog box. The designer can add a property to a step, in this case "Required for Flow Completion", by clicking on the associated "True" button 144. In addition, the dialog box includes a number of buttons such as "OK", "CANCEL", etc.

Figure 6:
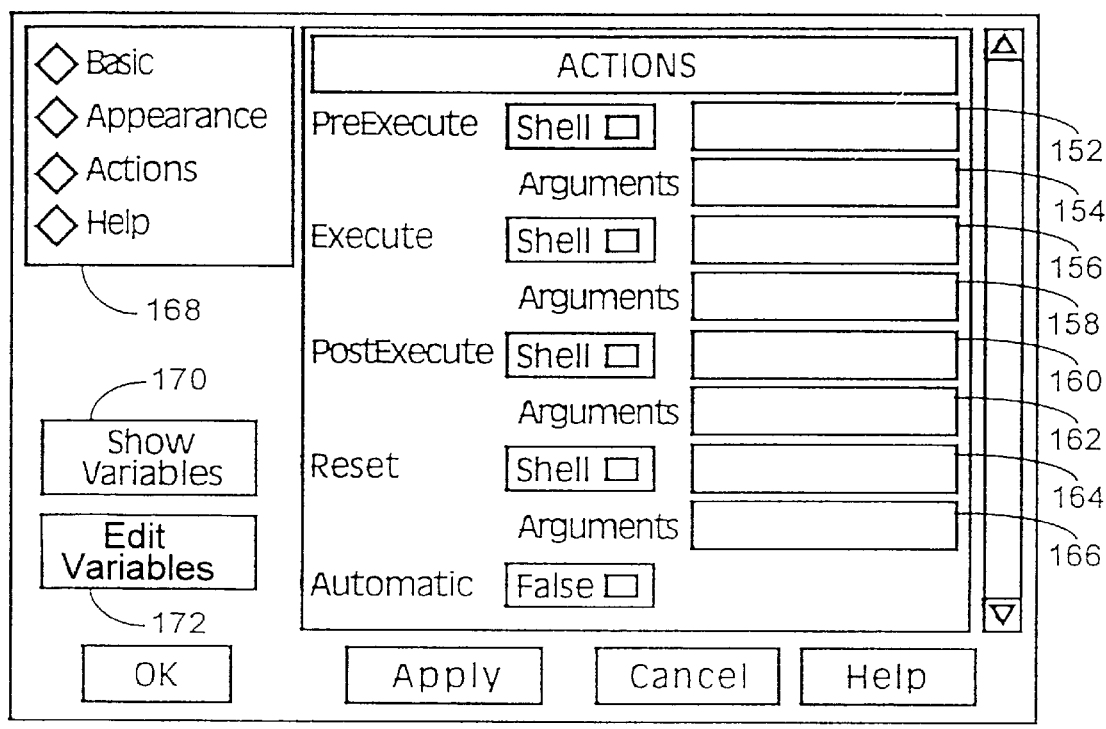
FIG. 6 illustrates yet another window of the graphic flow builder according to an embodiment of the invention.

The "ACTIONS" dialog box 150, depicted in FIG. 6, also includes a number of edit boxes 152–166. This dialog includes settings for three phases of execution: PreExecute 152, 154; Execute 156, 158; and PostExecute 160, 162. There is also a setting for Reset phase 164, 166. In the edit boxes entitled "Shell", the designer specifies the file name of the step encapsulation. In the edit boxes entitled "Arguments", the designer specifies the arguments to be passed to the step encapsulation. Like the "BASIC ATTRIBUTES" dialog box, this dialog box includes push button controls 168 to choose among dialog boxes for a step. In addition, the designer can view and edit variables by clicking on the "Show Variables" and "Edit Variables" push button controls 170, 172.

In this embodiment, the specific appearance and features of these windows (i.e. ACTIONS, BASIC ATTRIBUTES dialogs) can change depending on step type because different step types can require different types of information. For example, a decision step has branches, a subflow step has a related parent step, etc. Further details regarding definition of different step types in this implementation are discussed below.

While flow definition is described in terms of the flow builder in this embodiment, the manner of defining the appearance, dependencies and behavior of steps can vary without departing from the scope of the invention.

The illustrated flow builder takes the information obtained from the flow designer and stores it in a metalanguage format. The metalanguage is ASCII text based flow definition language used to describe a workflow. As an alternative to using the flow builder 80, a flow designer can build a template using the text editor to describe the template in the metalanguage, or other compatible flow definition language.

Before beginning to create a flow using either of the flow builder or the flow definition language, the designer first specifies a location for storing a workflow and its subflows in the flow definition language. A default structure, called a flow library, can be defined, and is provided by default. In addition to storing flow definitions, the directory also includes a location for storing step actions, which are typically programs such as shell scripts, C programs, AMPLE functions. Finally, the directory includes a location for storing graphical icons used in the workflow, which are typically graphics files in pixmap graphics (*.xpm) format.

Figure 7:
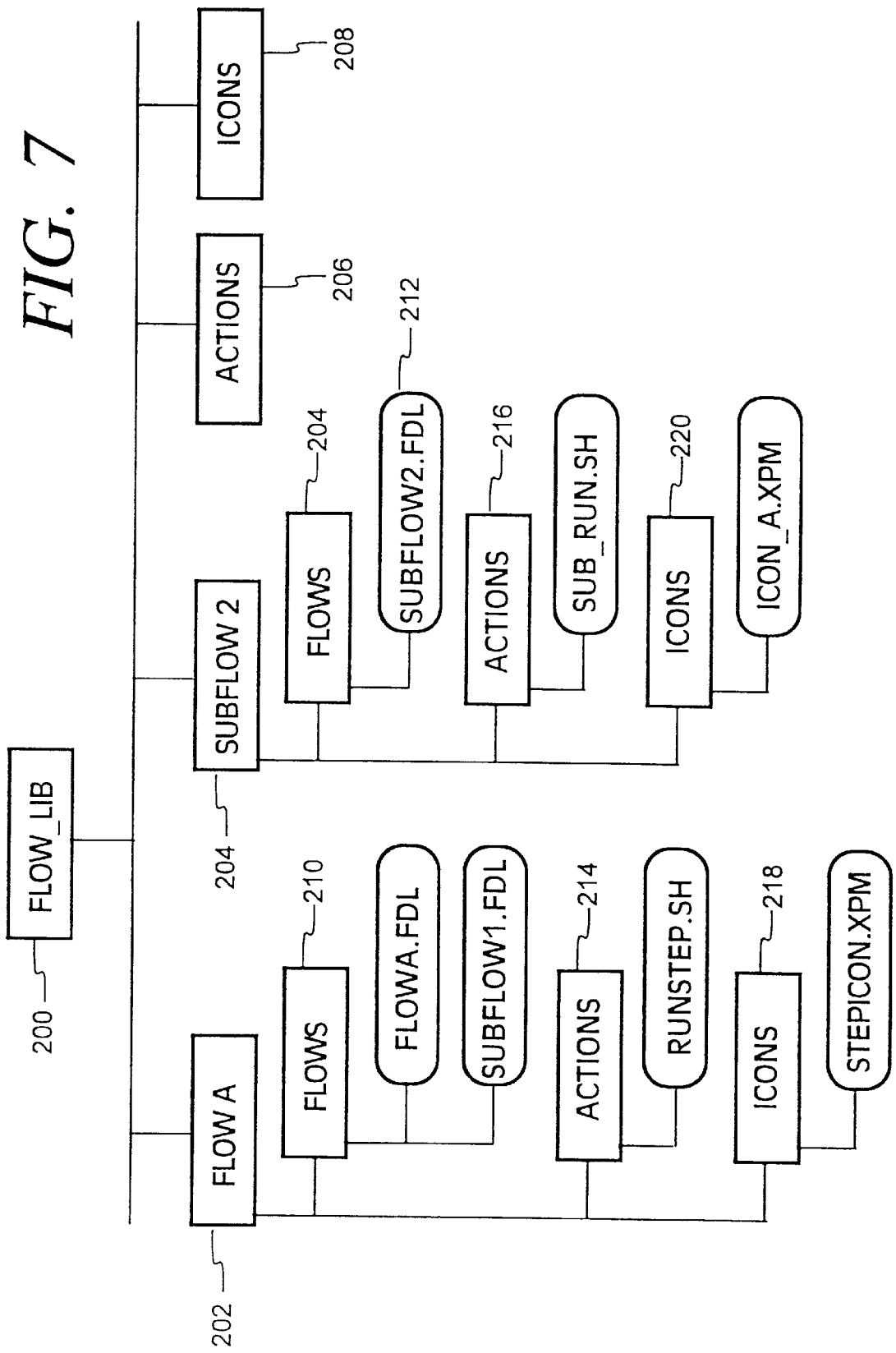
FIG. 7 illustrates an example of a preferred directory structure for a workflow.

FIG. 7 illustrates an example of the default directory structure for a workflow.

The default flow library structure allows the designer to group all of the components of a flow, including flow definitions, subflow definitions, actions, and icons, under the flow library directory. It also allows the flexibility of maintaining separate directories for subflows, which provides ready re-use of a given flow in more than one flow instance, and generic directories for actions and icons. The preferred flow library structure consists of a top level library directory (flow_lib 200) with three subdirectories: directories that contain flows (such as flowA 202 and Subflow2 204); a generic actions directory 206; and a generic icons directory 208. The flow directories 202, 204 are named with the same name given to the FLOWNAME.FDL file. Each flow directory has three subdirectories which are named as follows: "flows," 210, 212 holding the ASCII or binary flow definition(s) for the flow; "actions," 214, 216 holding the step and flow actions for the flow (such as run_step.sh); and "icons," 218, 220 holding the icons for the flow (such as stepicon.xpm). Located just under the flow library directory, the generic "actions" directory 206 contains actions for any of the flows in the flow library. Also located under the flow library directory, the generic "icons" 208 directory contains icons for any of the flows in the flow library 200.

After creating the flow library structure, the next step in creating a flow is to draw the graphics.

In constructing the workflow with the flow builder, the designer selects step instances from a number of pre-defined step types. For each step, the designer opens the basic attributes window and assigns a name to the step, and a label to appear in the step.

The workflow manager system includes a number of pre-defined steps that follow a flow diagram paradigm. The basic types of steps are task, decision, activity and subflow steps discussed in connection with FIG. 4. A task step represents a unit of work such as "compile a behavioral description of a circuit design", or "simulate a design". In addition to these basic steps, the workflow manager supports additional features including delayed binding of subflows to a subflow step, delayed binding of a step encapsulation to a step, and multi-instance steps. These additional features are described later.

Decision steps describe alternate paths through the workflow. The decision to follow a path can be based on a variety of conditions, ranging from conditions that the system can check without user input to conditions that involve prompting the user for input.

In creating a decision step, the designer specifies the task steps that are branches of the decision step, and also specifies any programs to be associated with the pre-execution, execution and post-execution phases of the step encapsulation.

Activity steps enable the user to describe commonly performed tasks that are not part of the execution sequence of the process. The activity step can define an activity that may be performed at any time during the process. An example of an activity step is "Email group regarding status of the project." In this embodiment, activity steps have an execution action, but do not include a pre or post-execution action.

Subflow steps enable the user to represent a number of related steps with a single step. This feature allows the user to simplify views of the workflow by creating a hierarchy of steps using the subflow step.

Designing a subflow is similar to creating a workflow, except that it has its own flow display. First, the designer creates the graphics for the flow and saves it. The flow builder places the subflow definition in the flow directory for the workflow. Then the designer returns to the parent flow, and selects the subflow option, i.e. clicks on a subflow icon. In the basic attributes window, the designer attaches the subflow to the workflow definition by listing the name of the subflow in the associated subflow setting. The dependencies are specified just as a normal task step. In the actions window, the designer can specify the pre-execute and post-execute actions. The execute actions are not specified, but instead the performance of the steps in the subflow take the place of the "execute" phase.

As part of the definition of a step, the designer can define a dependency relationship for the step. Step dependencies are the conditions that must be satisfied before a user can execute a step. When the designer captures a process in a workflow, the user defines a step dependency for each step by entering a dependency relationship. This dependency relationship can describe the precondition for a step in terms of step or data state variables, on the value of one or more predefined data variables, and on combinations of step and/or data state variables, and/or the value of predefined data variables. A step can have five states: STEP NOT READY (NR), STEP READY (R), STEP IN PROGRESS (IP), STEP COMPLETED (CP), and STEP FAILED (CF). To describe the dependency among steps, the user can, for example, define a dependency relationship in terms of state variables corresponding to these step states.

In the illustrated workflow manager system, the designer defines a dependency relationship in terms of a boolean expression of one or more step state variables. A variety of step dependencies are possible using this approach. For example, a "start-finish" dependency can be defined where a second step is dependent upon a first step being in the task completed state. A start-start dependency can be defined where a second step depends on another step being in the task in progress state. As another example, a finish-finish dependency can be defined where a first step cannot end unless a second step is in the task completed state. Using a boolean expression, the user can define a number of additional dependency relationships, including relationships based on the state of multiple steps.

The state of data can be represented using state variables as well. In this illustrated system, the data can be in one of the following four states: data not available (NA), data pending (DP), data ready (DR), and data approved (DA). The user can define a step dependency in terms of data state variables corresponding to these data states. The data state variables can also be used to track data maturity at varying stages of a design process.

To specify the action(s) associated with a step the designer selects the "actions" dialog box. This dialog box allows the designer to set three distinct phases of the step action: the pre-execute, execute, and post-execute phases. For each phase there are settings to specify the type of program that will run, and to pass arguments to the program. The type of program can include, for example, a shell script (which invokes other programs) or an AMPLE program. The first setting specifies the file name of the shell script or AMPLE program. By specifying this file name, the designer attaches the action performed or initiated by the program to the step. During this step definition process, the program is stored in the actions subdirectory of the flow directory. The second setting lists arguments to be passed to the program/script.

The step encapsulation describes how work associated with a step is performed. The step encapsulation can also describe how to re-execute a step or how to help the user during execution of the step. The step encapsulation specifies how to launch and control a program or programs that perform a task or assist the user in performing a task. For instance, the step encapsulation can launch a simulation program to simulate a design, or it can launch an editor to assist the user in creating or editing a design description.

The step encapsulation can also support communication between a program performing a task and the workflow manager system. A communication mechanism such as RPC or ToolTalk enables the step encapsulation to communicate data during execution of step. With this communication capability, the step encapsulation can generate reports from workflow data, or display messages relating to the status of the step such as "simulation 50% complete".

An example in the schematic design process further illustrates the functions of the step encapsulation during a step. A typical step in the schematic design process can be separated into three phases: pre-execution, execution, and post-execution. These phases correspond to checking out a design from storage, editing the design and checking the design back in. To support the pre-execution phase, the step encapsulation can include a shell script to assist the designer in checking out the design data. During execution, the step encapsulation can launch a program to help the user edit the design data. Finally during post-execution, the step encapsulation can include a script for checking in the data and placing the step in a state where it can be re-executed if desired.

The workflow manager API enables a step encapsulation to communicate and interact with the workflow manager system and workflow instance database. Table 1 below provides a list of functions in the API, along with a description. Other functions could, of course, be included.

The API for the workflow manager uses handles to identify all objects. When a routine makes an API call, the handle supplies a reference to the object being referenced. In this embodiment, "Object" refers to workflows, steps, variables (such as step state and data state variables), flow graphics, properties, and branches of decision steps.

A handle, in this embodiment, is a pointer to an unknown data type that points to an object in a workflow. "A pointer to an unknown data type" simply means that the calling routine does not have access to the literal value of the handle, though it can manipulate and retrieve handles through API functions. Handles are unique within workflow sessions and are created on demand to provide access objects.

TABLE 1

| Function Name | Handle | Function Purpose |
|---|---|---|
| wxGetActionPath( ) | Any | Returns the path to the requested action . . . |
| wxAppendAnnotationText( ) | Flow Step | Appends annotation text to the annotation text stream |
| wxGetAnnotationText( ) | Flow Step | Returns the annotation text stream |
| wxAppendAnnotationText( ) | Step Flow | Appends an annotation to the annotation text stream |
| wxGetAnnotationText( ) | Step Flow | Retrieves the annotation text stream |
| wxDisableBranch( ) | Branch Flow | Disables a branch |
| wxGetBranchEnableStatus( ) | Branch | Tells you whether or not the branch is enabled |
| wxGetBranchIterator( ) | Step | Returns the handle of the first branch |
| wxGetBranchName( ) | Branch | Returns the branch name |
| wxGetBranchHandle( ) | Branch | Returns the handle of the branch |
| wxGetNextBranch( ) | Step | Returns the handle of the next branch |
| wxSelectBranch( ) | Branch Flow | Sets the state of the flow to one of the state acronyms |
| wxGetFlowGraphicHandle( ) | Any Flow | Returns the handle for a flow graphic |
| wxSetFlowGraphicEnableStatus( ) | Graphic | Enables a flow graphic for execution or disables it |
| wxSetFlowGraphicVisibleStatus( ) | Graphic | Displays or hides a flow graphic |
| wxCloseFlow( ) | Any | Closes the flow |
| wxGetFlowHandle( ) | Any | Returns the handle of the current flow |
| wxGetFlowState( ) | Any | Returns the state of the flow |
| wxGetFlowViewOnlyStatus( ) | Any | Returns the view or execute state of the flow |
| wxGetParentFlowHandle( ) | Any | Returns the handle of the subflow's parent flow |
| wxGetParentFlowHandle( ) | Any | Returns the handle of the subflow's parent flow |
| wxOpenFlow( ) | Any | Opens the flow |
| wxSetFlowState( ) | Any | Sets the state of the flow to one of the state acronyms |
| wxSetFlowViewOnlyStatus( ) | Any | Sets the flow to view-only or execute state |
| wxGetBranchHandle( ) | Step | Returns the branch handle |
| wxGetFlowHandle( ) | Any | Returns the handle of the current flow |
| wxGetFlowGraphicHandle( ) | Any | Returns the handle of the flow graphic |
| wxGetHandleType( ) | Any | Returns the handle type |
| wxGetParentFlowHandle( ) | Any | Returns the handle for the parent flow of a subflow |
| wxGetPropertyHandle( ) | Step | Returns the property handle |
| wxGetStepHandle( ) | Step | Returns the handle of the step |
| wxGetVarHandle( ) | Any | Returns the handle for the variable |
| wxWriteMessage( ) | Any | Displays the string in the FlowXpert message area |
| wxGetPropertyHandle( ) | Any | Returns the handle of the property |
| wxGetPropertyValue( ) | Any | Returns the value of the property |
| wxSetPropertyValue( ) | Step Flow | Sets the value of the property |

TABLE 1-continued

| Function Name | Handle | Function Purpose |
|---|---|---|
| wxGetFlowState( ) | Flow | Returns the state acronym for the current state of the flow |
| wxGetStepState( ) | Step | Returns the current state of the step |
| wxGetVarState( ) | Variable | Returns the state of the variables |
| wxSetFlowState( ) | Flow | Sets the state of the flow to the state |
| wxSetStepState( ) | Step | Sets the state of the step to the state |
| wxSetVarState( ) | Variable | Sets the state of the variables |
| wxFalconReturnStatus( ) | Any | Used with AMPLE functions to return status of the API |
| wxGetExecReturnStatus( ) | Step | Returns exit status of an execution function for the use of a post-execution function |
| wxGetToolExitStatus( ) | Step | Returns the exit status of the last tool run by a step |
| wxGetToolStatus( ) | Step | Returns the current status of the last tool run by a step |
| wxExecuteStep( ) | Step | Exectues the step |
| wxGetNextStep( ) | Any | Resets the list of steps in a flow to the step first defined |
| wxGetStepEnableStatus( ) | Step | Returns the step's enable status, telling you whether the step is enabled or disabled |
| wxGetStepHandle( ) | Any | Returns the handle of the step |
| wxGetStepIterator( ) | Any | Returns the next step handle |
| wxGetStepLabel( ) | Step | Returns the step label |
| wxGetStepName( ) | Step | Returns the step name |
| wxGetStepState( ) | Step | Returns the state acronym for the current state of the step |
| wxGetStepWarningFlag( ) | Step | Tells you if a step has a warning flag and the warning flag type |
| wxResetStep( ) | Step | Resets the step |
| wxSetStepEnableStatus( ) | Step | Allows you to enable or disable the step from the API |
| wxSetStepState( ) | Step | Sets the step to the state |
| wxFalconInvokeTool( ) | Step Flow | Invokes the tool |
| wxGetToolExitStatus( ) | Step | Returns the last tool run from a step |
| wxGetToolStatus( ) | Step | Returns the current status of the last tool run from a step |
| wxGetVarHandle( ) | Any | Returns the handle of the variable |
| wxGetVarState( ) | Variable | Returns the state of the variable |
| wxGetVarValue( ) | Variable | Returns the current value of the variable |
| wxSetVarState( ) | Variable | Sets the state of the variable |
| wxSetVarValue( ) | Variable Workflow | Sets the value of the variable |
| wxSetUIVisibleStatus( ) | Any | Displays or hides the user interface |

To summarize, the process of defining a workflow includes defining steps in the workflow and associating actions with the steps. After defining a workflow template, the flow designer then creates an instance of a template, a working copy of the workflow created from the template.

The instance or working copy is placed into a project directory where information about the workflow instance is stored.

Figure 8:
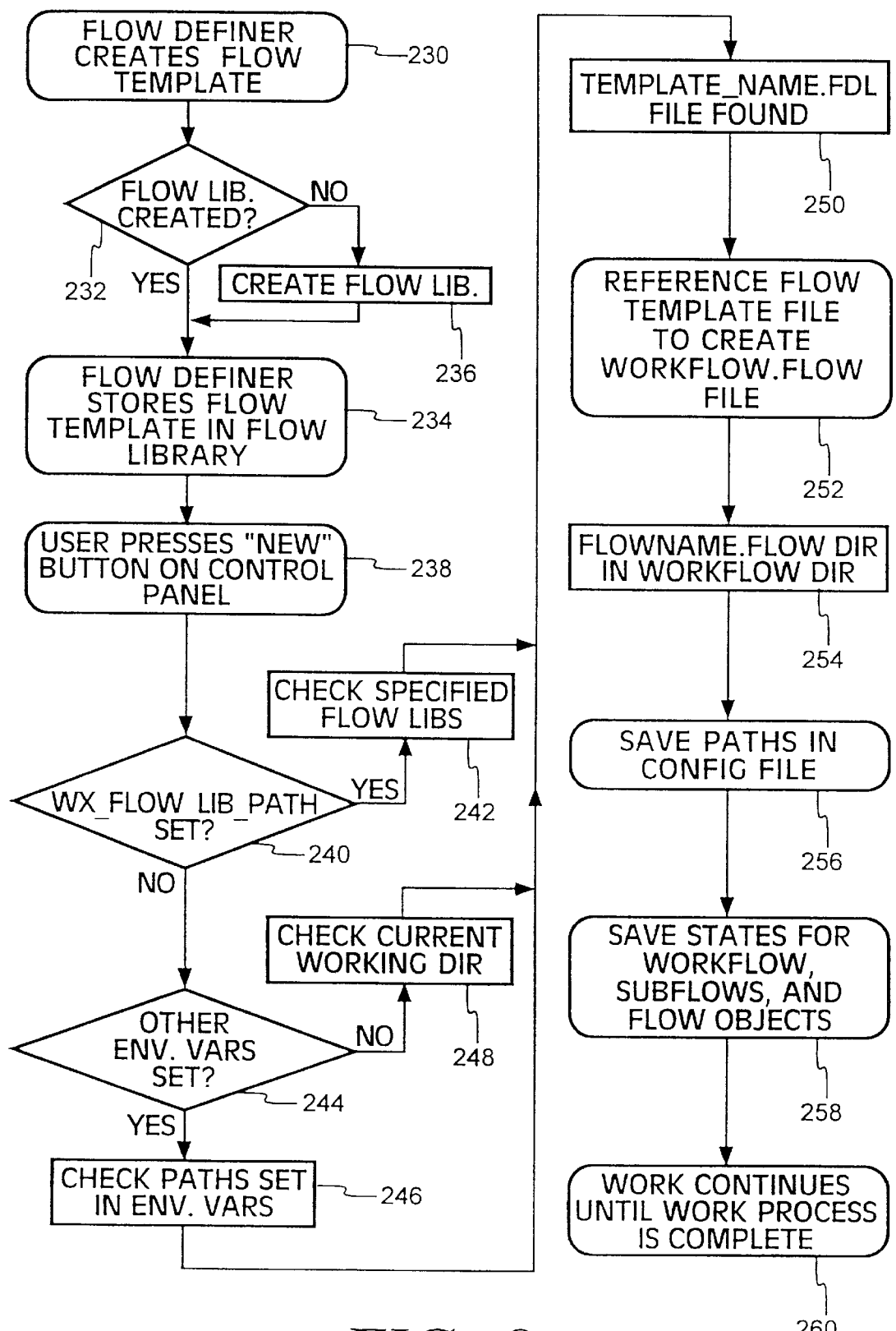
FIG. 8 is a flow diagram illustrating the process of defining a workflow template and creating an instance of a workflow from the template according to an embodiment of the invention.

FIG. 8 illustrates the process of defining a template and creating an instance of a workflow from the template.

In a first step 230, the designer creates the flow template, which in turn creates a "template_name.fdl" file. The flow template includes the graphical model for a work process. It can also reference other flow templates as subflows for the work process. The flow template itself remains intact as a reusable resource, unless the designer chooses to change or refine the template. The decision step 232 refers to the inquiry whether a flow library already exists in which the flow template can be stored. If a flow library exists, the designer stores the flow template in this flow library (234). Otherwise, the designer creates a flow library and then stores the template in this flow library (236). When the user, such as an engineer or project manager, wants to create an instance of a workflow to perform the work as specified in the workflow, that user invokes the workflow manager system and selects the new button on the control panel 88 to create an instance of a workflow (238).

In decision step 240, the workflow manager system checks an environment variable to show possible flow library contents in a list box. The workflow manager system supports a number of environment variables that assist the user in finding workflows and their components. Each of these environment variables is a colon-separated list of locations. For example, a variable named "WX_FLOW_LIB_PATH" points to the location of the recommended flow library. If the flow designer has not used the preferred flow library structure, there are a number of environment variables that enable the workflow manager system to find flows, actions, and icons. For example, the variable "WX_FLOW_PATH" specifies locations of binary or ASCII flow definitions. The "WX_ACTIONS_PATH" variable specifies locations of step and flow actions. Finally, the "WX_ICON_PATH" variable specifies locations of icons.

When a user instantiates a workflow with a designated flow file, the workflow manager system searches for the workflow and its associated components as follows. If the "WX_FLOW_LIB_PATH" variable is set, the workflow manager system looks in the designated flow libraries (242). First, the workflow manager system looks for the "flowname/flows/flowname.fdl file." The flowname directory must contain a flow template that matches the flowname. For example, the flowA directory, shown in FIG. 7, has a flowA.fdl file in its flows directory. The workflow manager system then looks in the flowname/flows directory for any attached subflow.

Referring again to FIG. 7, the workflow manager finds subflow1. fdl in the flowA/flows directory. If subflows are not found in the flowname/flows directory, the workflow manager looks at the other flow directories just under the library directories in the "WX_FLOW_LIB_PATH" path. If the workflow manager finds a flow directory that matches the subflow's name exactly (such as Subflow2 in FIG. 7), it then looks in the flows directory for that subflow to find a flow template. The workflow manager then looks for actions and icons in the appropriate directories under the named flow directory first. If an action or icon is not found there, the workflow manager checks any named subflow directories, if appropriate, and then looks in the generic actions and icons directory in the flow library directories.

Step 242 in FIG. 8 represents the process of checking the designated flow libraries when the WX_FLOW_LIB_PATH variable is set. If this variable is not set, the workflow manager checks to see if environment variables are set as reflected in decision step 244. If so, the workflow manager looks in the "WX_FLOW_PATH" variable locations for the designated flow file (246). Also, the workflow manager looks in the directories listed in "WX_ACTIONS_PATH" and "WX_ICON_PATH" for associated actions and icons.

However, if none of the path variables are set, the workflow manager assumes a flat structure and looks in the current working directory only (248).

Ultimately, the workflow manager finds the specified "template_name.fdl" file (250). Next (252), the workflow manager reads the template to create the actual workflow, and saves the workflow instance data in the "flowname.flow" file in a specified workflow directory (254). This leaves the flow template and any related subflow templates intact, while creating the workflow.

The workflow manager saves the path to the flow components in a configuration file (256). Next (258), the workflow manager also saves the current state of the workflow and any subflows, as well as the state of all flow objects, including steps, properties, variables, extended graphics and text, and decision step branches.

The final step 260 represents work performed using the workflow instance. The workflow manager saves the state of the workflow each time a flow or flow object changes state or value.

When a user elects to open the "flowname.flow" workflow file, the workflow manager displays the flow setting steps to the states mandated by their dependencies. After opening the workflow file, the user(s) can begin to perform work with the workflow. The work process continues until the workflow is complete.

During a process, the workflow manager system guides a user or a number of users though the workflow. The flow display graphically displays the workflow, including a graphical representation of step and data states. To execute a step, the user clicks on a step in the flow display. The flow management engine first checks the step dependency to verify that the preconditions to executing the step are satisfied. If they are, the flow management engine retrieves the step encapsulation associated with the step and then causes the program or script in the step encapsulation to be executed.

Figure 9:
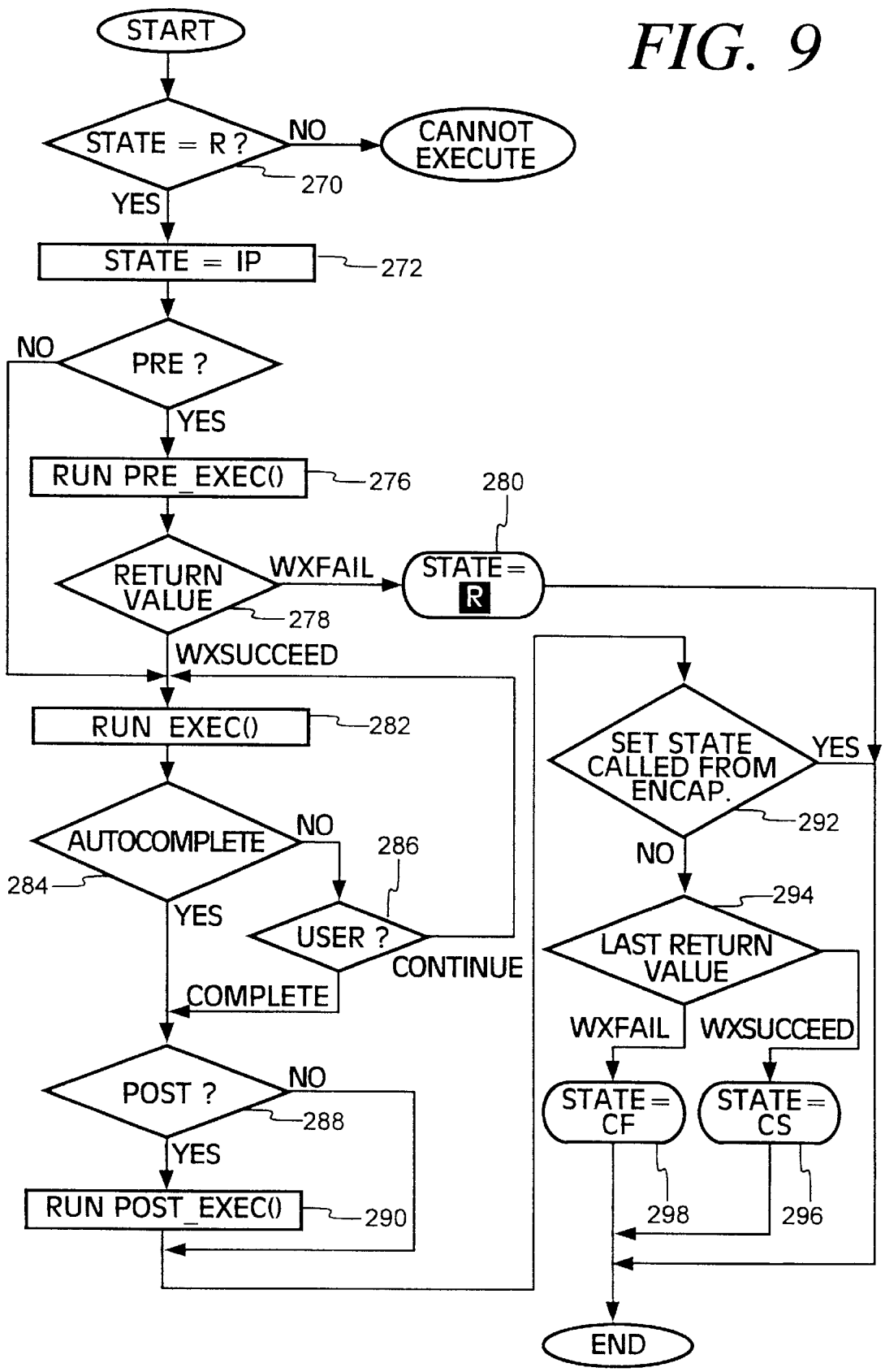
FIG. 9 is a flow diagram illustrating the process of executing a task step in the workflow manager system according to an embodiment of the invention.

FIG. 9 illustrates the process of executing a task step in the workflow manager system. In decision step 270, the flow management engine determines whether the step's dependencies are met. If the step is in the ready (R) state, then the step's dependencies have been met.

When the user executes the step, the step state changes to the "in progress" state (272). If a pre-execution action exists in the step definition (274), the flow engine calls the associated program (276). If the pre-execution action succeeds, the step encapsulation returns "wxSUCCEED" (278). However, if the pre-execution action fails or aborts, it returns "wxFAIL" (278). The step state indicator then becomes an inverted R (inverted Ready) on the flow display and processing stops for that step (280).

If there is no pre-execution action or if the pre-execution action succeeds, the flow management engine runs the step's execution action (282). If the execution action succeeds, it returns "wxSUCCEED". However if the execution action fails or aborts, it returns "wxFAIL". The flow management engine causes the flow display to indicate an inverted IP (In Progress), which indicates that the processing has stopped for the step.

The post-execution action, if one exists, runs in one of two ways: if the auto completion flag is set to true in the flow definition (284), the step proceeds to the post-execution action automatically. Otherwise the user decides when the step execution is complete (286).

If the step includes a post-execution action (288), then the post-execution executes as reflected in step 290. The final state of the step is then determined. The API provides a function called "wxGetExecReturnStatus" that returns the status of the execution phase. As reflected in decision step 292, this function can be called during the post-execution phase to set the state of the step. If the function is called from the post execution action and succeeds, it returns the status of the execution action. Otherwise, it returns "wxFAIL."

If the "GetExecReturnStatus" function is not called from the post-execution action, then the flow engine uses the last return value to determine the completion state of the step (294). If the last return value is "wxSUCCEED" then the flow engine sets the step state to step completed (CS) (296). Alternatively, if the last return value is "wxFAIL", then the completion state of the step is set to step failed (CF) (298).

Figure 10:
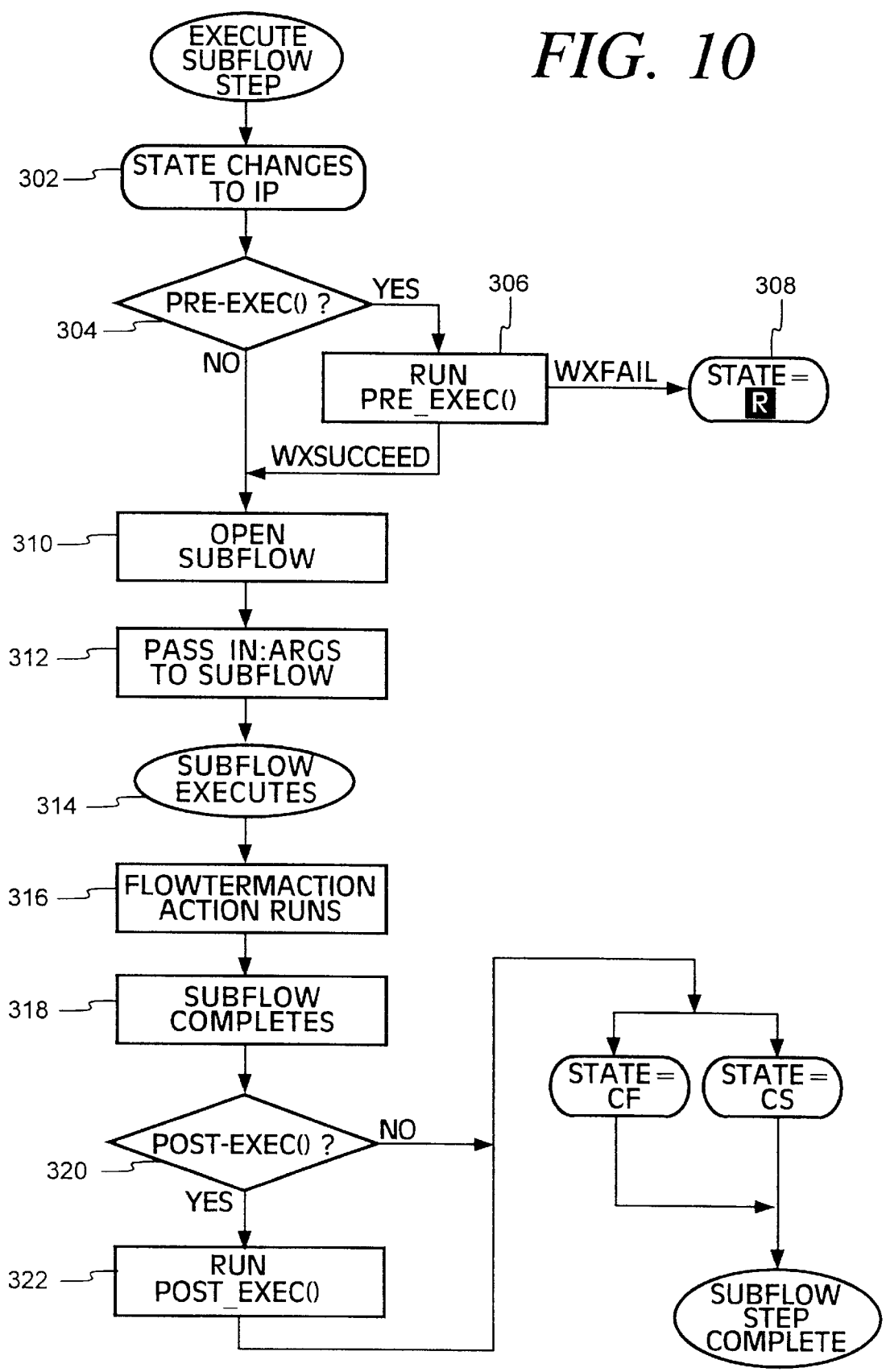
FIG. 10 is a flow diagram depicting the process of executing a subflow step in the workflow manager system according to an embodiment of the invention.

FIG. 10 depicts the process of executing a subflow step in the workflow manager system. Before the step can be executed, the subflow's step dependencies must be met. When the subflow's step dependencies are met, the state of the step moves to the ready state.

When the user selects the subflow step in the ready state, the flow management engine changes the step state to "in progress" (302).

If a pre-execution action is defined for the subflow step (304), the flow engine runs the pre-execution action (306). If the pre-execution action succeeds, it returns "wxSUCCEED". However, if the pre-execution action fails or aborts, it returns "wxFAIL". As with the task step, the flow display indicates that processing has stopped for the step by displaying an inverted ready state on the display screen (308).

If no pre-execution action exists or the pre-execution action exists and has been successfully run, the flow engine opens the subflow specified in the flow definition (310). Next, in step 312 the subflow step passes any arguments to the subflow.

At this point the subflow executes (314). If an initialization action is defined for the subflow, the flow engine runs the associated initialization action. An initialization action may be required the first time a flow is opened. Initialization actions can include, for example, setting variables to desired values, verifying the existence of data, checking data out of an archive, and so on. When the subflow finally moves to a completed state (CF or CS), the "FlowTermAction" runs (316). The "FlowTermAction" provides a shut down mechanism for exiting a completed workflow. Such exiting actions might include checking-in completed data or a completed design configuration, cleaning up files and so on.

After the "FlowTermAction" completes, the subflow is also completed (318). The subflow step returns the completion state of the subflow step (CS or CF) and "OUT" arguments from the subflow.

If a post-execution action is specified for the subflow step, the flow management engine runs the post-execution action as illustrated in decision step 320 and step 322. After the post-execution action is run, the state of the steps should be the state of the subflow, unless the subflow step state is set in the post-execution step encapsulation. As such, the completion state is either the state of the subflow or the step state set in the post-execution step, if one exists.

Figure 11:
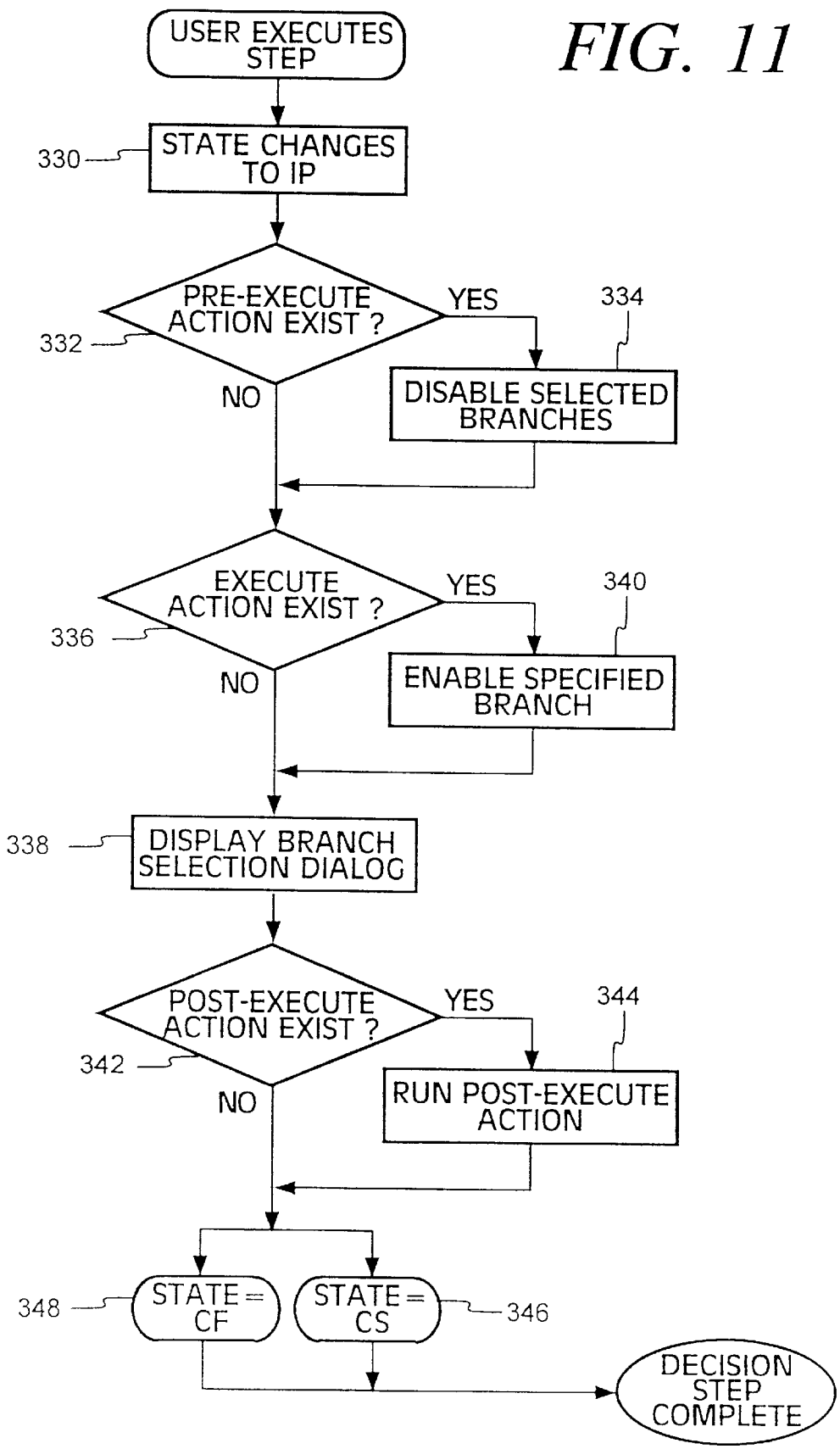
FIG. 11 is a flow diagram illustrating the process of executing a decision step in the workflow manager system according to an embodiment of the invention.

FIG. 11 illustrates the process of executing a decision step. When a user executes a decision step, the step moves from the "ready" state immediately to the "in progress" state (330). Next, the flow management engine checks to see if a pre-execution action is defined (332). If it is, the flow management engine calls the pre-execution program (334). Typically, a pre-execution action in a decision step is used to disable one or more branches, which removes the disabled branches from possible selection (334). In the illustrated embodiment, branches are in one of two checkable states: enabled or disabled. If the branch is enabled, the branch is a selectable branch. When a branch is disabled, the flow engine checks each step in the branch to see if the step is used by another branch. If it is, the step is disabled only if the other branches that uses the step are also disabled.

If no execution action is defined (336), the flow management engine displays the branch selection dialog box, which allows the user to select a branch for execution (338). If the user selects a branch, the flow management engine disables the other branches and evaluates the dependency expressions for all the steps in the selected branch. The steps in the disabled branches become gray in appearance, graphically indicating that they cannot be executed.

If an execution action exists, the flow management engine runs the execution step encapsulation. The step encapsulation chooses a branch to enable, since the existence of an execution step encapsulation prevents the branch selection dialog box from being displayed (340).

If a post-execution action exists (342), then it is run (344). After the post-execution action is run or if no post-execution action exists, the state of the decision step is set to either CS or CF (346, 348).

The workflow manager system enables the user to reset a decision step. If the user resets a decision step, the flow management engine resets the step to the ready state if the dependency expression still evaluates to true. If however conditions within the workflow have changed so that the decision step's dependency expression no longer evaluates "true", the decision step state becomes "not ready." The steps within the branches are reset to their original state, even if the branch is executing. Branches that have been disabled are re-enabled.

Activity steps have a relatively simple execution sequence compared to task steps. If the activity step's dependencies are met, the step state changes to ready. When a user executes an activity step, the step state changes to "in progress". If the execution of the activity steps succeeds, it returns "wxSUCCEED". Conversely, if the execution of the activity step fails or aborts, it returns "wxFAIL". Regardless of the return value of the execution action, the activity step returns to the ready state.

Figure 12:
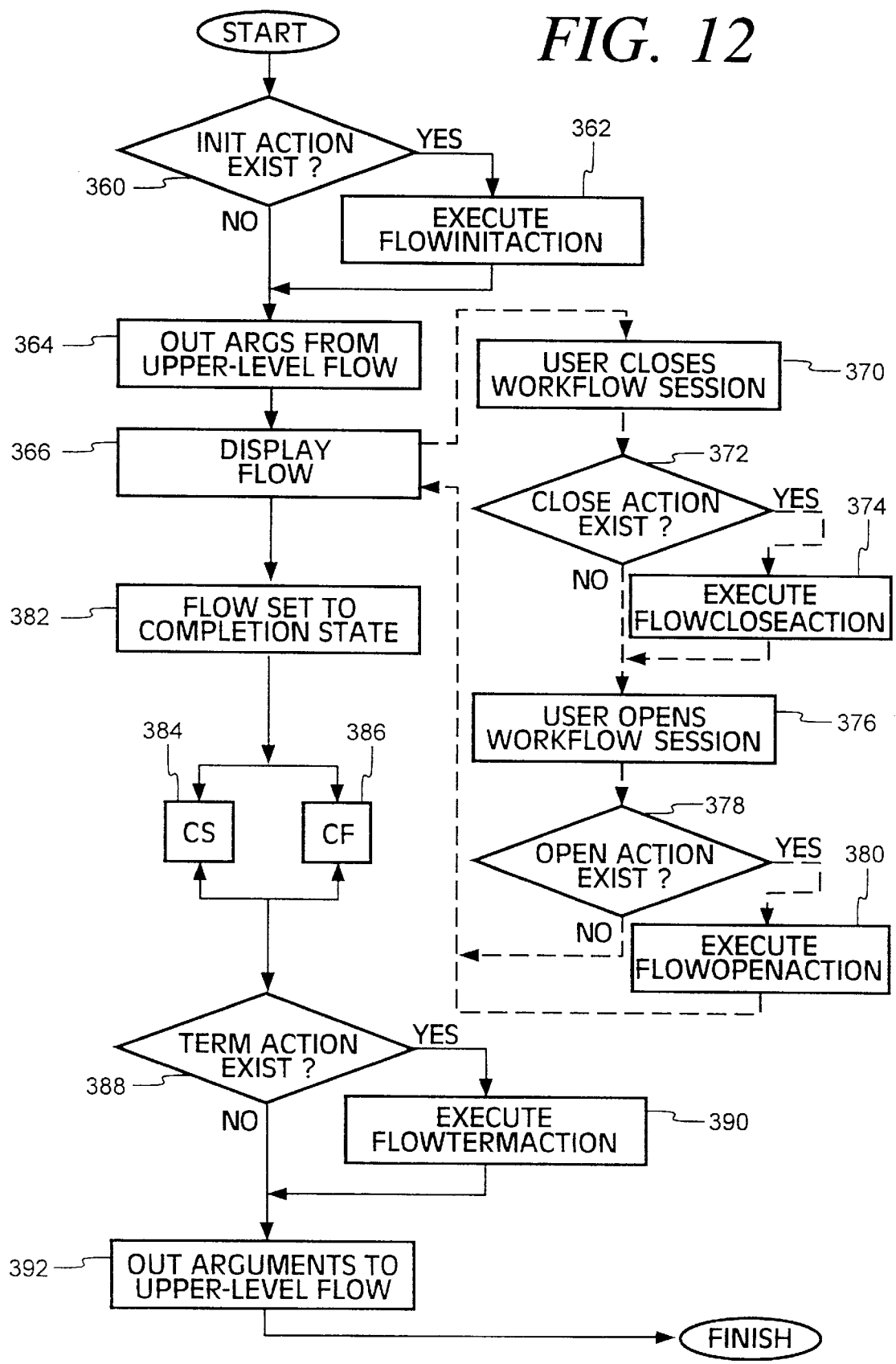
FIG. 12 is a flow diagram depicting the execution sequence of a workflow in the workflow manager system according to an embodiment of the invention.

Like steps, workflows also have an execution sequence. FIG. 12 depicts the execution sequence of a workflow.

First, a user instantiates the workflow by pressing the new button on the control panel 88 and filling out a "Create New Workflow" dialog box or by opening a subflow. At this point the flow state changes to "in progress".

If an initialization action exists (360), it executes (362). If the flow is a subflow and has "IN" arguments, the "IN" arguments are copied in from the upper-level flow. Subflows can use "IN" and "OUT" variables which allows the subflow to take upper-level flow variables and set them to local variables in the subflows. "OUT" variables are automatically passed back to the upper-level flow when the subflow completes (364).

In the next step, the workflow manager system displays the instantiated workflow using a flow display on the display screen (366). Since a workflow may be used over a period of days or months, users probably open and close the flow for a number of work sessions. Steps 370–380, separated with dashed relation lines, correspond to steps performed when users work with an instantiated workflow.

When a user closes an instantiated workflow after a work session (370), a "FlowCloseAction", if any exists (372), executes (374). A "flowcloseaction" is an action performed when the user closes a workflow after a work session. Examples of this type of action can include cleaning up extraneous files, doing a local check-in of data, creating reports, etc.

When a user opens a previously instantiated workflow for a new workflow session (376), a "FlowopenAction", if any exists (378), executes (380). A "FlowOpenAction" specifies the actions the workflow manager system takes when a user opens an existing workflow. Typical actions of this type include checking out local data, opening files, checking the state of the workflow, and other similar tasks. If the flow designer did not specify any special actions to be taken when the user opened an instantiated flow, the workflow manager system only opens the workflow.

The next step 382 is to set the workflow to a completion state. The workflow management systems sets the workflow to a completion state when the user completes all of the required steps. All steps are considered to be required unless the "optional" property is set. Alternatively, a step can set the flow state to a completed state by calling a function to set the flow state. Either way, the state of the flow changes to a completion state (CS or CF) (384, 386). At this point if a "FlowTermAction" exists, it executes (388, 390). A "Flow-TermAction" provides a shut-down mechanism for exiting a completed workflow. Such exiting actions can include checking in completed data or a completed design configuration, cleaning up files, and so on. The "FlowTermAction" executes when the workflow moves to a completion state (CS or CF).

If the flow is a subflow and has OUT arguments, the OUT arguments are copied to the upper-level flow. OUT variables are automatically passed back to the upper-level flow when the subflow completes (392).

As should be apparent from FIG. 12, a number of actions can be associated with opening, closing or completing a workflow. A reset action can also be associated with a flow and executed when the user resets a flow. A flow designer can designate an action to be executed every time a flow is reset. For example, a data state or step state variable can be reset every time a flow is reset. If the flow designer does not specify any action to be taken when the flow is reset, the workflow manager system performs the reset according to a default behavior.

Though the behavior of a flow or step can vary when reset, the workflow manager system behaves as follows when a flow or step is reset. A flow or step will not reset if an action is running (in the "in progress" state). In other words, if an action is currently running in a subflow, the user cannot reset the subflow step or the upper-level flow. If the user resets a step, the workflow manager system checks to see if the step has any dependent steps. If it does, it will not reset the steps if the dependent steps are running actions.

As introduced above, the workflow manager supports a number of advanced features including delayed binding of subflows, delayed binding of step encapsulations to steps, and multi-instance steps. Theses advanced features are described below.

Delaying the binding of subflows allows run-time information to determine which flow is bound to a subflow step. The "rules" here are patterned after the implementation of the decision step. Similar to the way the decision step defines a list of possible branches, a subflow step with delayed binding defines a list of possible subflows. During the execution of the flow, the actual subflow is selected either by the user or from a program, again similar to the selection of a branch in a decision step.

Typically, when a subflow step is defined, the subflow to attach to the step is specified at that time. For delayed binding, the flow definer specifies a set of candidate subflows (similar to specifying the branches for the decision step). Each subflow has its own set of arguments (IN/OUT).

In defining a typical subflow step with delayed binding of subflows, the flow definer specifies the flow name, as well as the pre and post execution actions for the subflow step. Unlike the normal subflow step, the flow definer also specifies the subflow candidates and the IN/OUT arguments for these candidates.

During execution, the subflow step will have a default behavior. When executed, the pre-execute phase is run and the user is presented with a list of choices (i.e. a list of the subflows that can be bound). The user selects a subflow which is then "bound" to the subflow step. From that point, the subflow executes just like a normal subflow, with the parent step's post-execution action running after the subflow completes. The first subflow in the list of candidates in the flow definition will be the default. Resetting the subflow step does not automatically unbind the subflow. The subflow can be unbound during the reset by using an API call, wxUnbindSubflow( ), in the ResetAction for the subflow step. This addresses the case where the preexecute for the step binds the subflow (via the API) and possibly some other setup based on that binding. By allowing the unbinding in the ResetAction, the flow definer can guarantee that any cleanup/re-initializing is performed during the reset.

In this embodiment, several constraints require that a subflow step be in the NR or R state before the unbind. If wxUnbindSubflow( ) is called for a subflow step in the IP state, then that subflow step will automatically be reset.

In addition to delayed binding of subflows to subflow steps, a step encapsulation can be dynamically bound to a step.

Delayed binding of steps allows the run-time user to dynamically choose a step encapsulation (set of actions) for step from one of several available for that step, as defined by a flow definer. Consider the scenario: Assume a flow that contains a step that can be used with tools A and B:

(1) First the flow designer defines the step with the flow builder. During that process he indicates that the runtime user will choose which tool to execute (i.e. perform a delayed binding of an encapsulation for that step).

(2) The flow designer then creates a "tagged set" of encapsulations from which the run-time user will choose. A default choice may be included.

In the flow definition, the flow definer specifies a tag for each step encapsulation that can be bound with the step. For example, the flow definer identifies the step encapsulation for Tool A as "ToolA", and identifies the step encapsulation for Tool B as "ToolB." Then the flow definition specifies that the step has delayed binding (e.g. DelayedEncapsulation-Binding True), and it lists the possible step encapsulations: ToolA and ToolB.

At run-time, the user of the flow can choose one of the encapsulations available, and that encapsulation then provides the flow engine with appropriate actions for that step.

When the user is presented with the choices, the first item listed is the default. For this encapsulation example, the first encapsulation listed, ToolA, is the default encapsulation for that step. Once an encapsulation is chosen, the step behaves just like any other step.

The work flow manager also provides a means for the run-time user to choose another encapsulation. If he does so, then the step will be effectively reset prior to the re-binding of the encapsulation.

In addition to the step types described above, the workflow manager also supports "multi-instance" steps. Multi-instance steps are used to model two kinds of situations: 1) partitioning of a larger task, and 2) exploring alternative solutions to a task.

In the first case, the multi-instance step represents the results of carrying out the same process on various parts of the whole solution. For example, if a designer is building an ASIC, she may not know ahead of time how many sub-blocks the ASIC will have. If she wants to use a subflow for each sub-block, the workflow manager needs a way to allow the number of subflows for the design to grow (and shrink) dynamically. With a multi-instance step, the workflow manager supports dynamic changes in the number of subflows by allowing the user to add or delete instances of a subflow step during a workflow session.

In this case, instances of a subflow added during a session can be used by down stream elements of the flow. A "multi-instance" subflow step is considered complete when all of its instances are completed. The results returned from the multi-instance subflow step to its parent workflow may be a function of the results of any or all the instances.

The second use of a multi-instance step is for "what if" situations. In a particular section of a design (represented by a subflow), various combinations of components, tools or input parameters to tools can be varied to determine the optimal choices for that component. After completing some or all of the variations, the information from the instances will be examined, and one instance will be selected for propagation to down stream steps. Note that it may be valid to proceed with down stream steps when only one of the subflow instances has completed, if one of them generates an acceptable answer during the what-if process. For example, if various instances were exploring alternative layouts, the first one to come up with a layout that fit within the prescribed area limit could be chosen.

A multi-instance step has similar behavior to a subflow step, but it also includes additional support for managing instances. The first time a multi-instance subflow step is executed from the Ready state its pre-execution action is run. This is the same behavior as a single-instance subflow step. In the default pre-execution implementation, the user is presented with a dialog box (400) similar to the one in FIG. 13.

From this dialog box (400), the user can choose to either create a new subflow instance for the step (402), re-open (i.e. continue) (404), obtain information about (406), or delete an existing instance (408). The dialog box also provides helpful information regarding instances of the subflow such as the name, state, and current user.

To "create" a new instance of a multi-instance step, the user is prompted for a name and comment for the instance. This information is used to uniquely identify the instance. Then, the workflow manager attaches a new instance of the subflow and begins executing the subflow. Execution of the subflow is as described previously for single-instance subflows (i.e. arguments are passed in, InitAction is run, etc.). When the first subflow instance is created, the multi-instance subflow step state moves from Ready to the "in progress" (IP) state.

Each time the step is "executed" from IP state, its pre-execution action is run again. This is different from the behavior of single-instance subflow step, since every execution of a multi-instance subflow step has the possibility of creating another instance.

The default implementation of the post-execution action, which is built into the workflow manager, is to run if no user post-execution action is specified. In the default post-execution action, the multi-instance subflow step completes when all of the current subflow instances are complete; otherwise the sub-flow step remains in an IP state. A dialog box showing the available instances and their results (completion status and OUT arguments) is presented to the user so the user can choose which instance's results should be returned to the parent flow as the result of the overall subflow step.

If a user-specified post-execution action is provided, it can cause the step to return status and OUT arguments which are a synthesis of the results of some or all of the instances. This function might declare the step completed on the basis of less than all instances completing, or it might withhold completion even though all existing instances have completed if, for example, none of the alternatives reached a satisfactory result. In this case, the subflow step indicates that all existing instances have completed, but some may need to be reset and retried or more may need to be created to reach a satisfactory outcome.

Each time a new instance is added, the subflow step moves from CS to an IP state and waits for completion. The effect of the reset on down stream steps depends on the dependency expression of those steps. Resetting the multi-instance subflow step includes looping through a reset on each of the multiple instances, and then resetting the step itself.

Figures 13, 14:
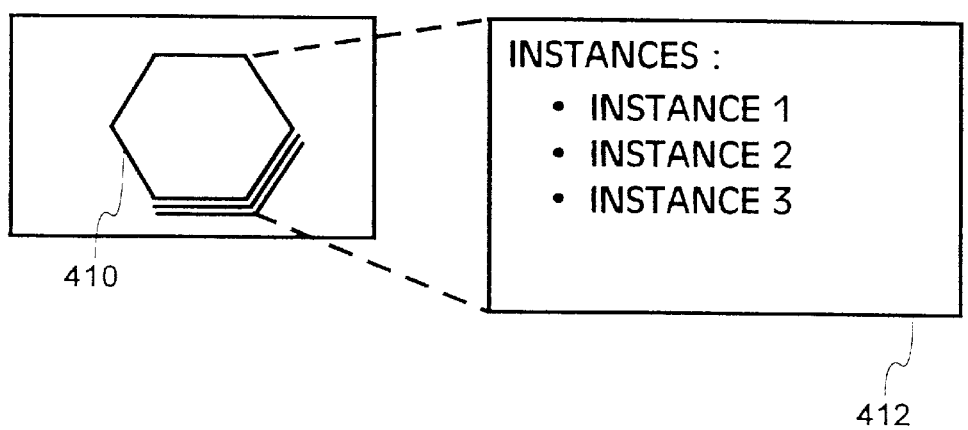
FIG. 13 illustrates an example of a dialog box used in connection with multi-instance steps in the workflow manager system according to an embodiment of the invention.
FIG. 14 illustrates an example of a multiinstance step in the workflow manager system according to an embodiment of the invention.

The multi-instance step in this implementation has a unique graphical appearance to distinguish it from other steps in a flow display. FIG. 14 illustrates an example of a multi-instance subflow step 410. Although the multi-instance step can be implemented as a separate step type, it is implemented as an option in the subflow definition in this embodiment. As shown in the example of FIG. 14, the multi-instance step "M1" (410) has three step instances as graphically depicted by the dashed lines leading to a box (412) representing the instances. The number of instances associated with the multi-instance step vary as the user or another routine adds or deletes instances.

The workflow manager provides execution and tracking features. As introduced above, the workflow manager maintains historical data associated with a workflow instance in a history log file. From this log file, the workflow manager can generate reports on specially identified tasks and data in a workflow. In addition, a user can specify time constraints for execution of the steps in a workflow. For example, a project manager can specify an early start/finish, a preferred start/finish, and a late start/finish. When these or other types of constraints are specified, the workflow manager can generate "actual vs. baseline" data, and this data can be exported to project management programs such as Microsoft Project, MacProject and AutoPlan II.

The workflow manager can also display project probes which provide a dynamic link to data relating to a workflow. A project probe is a reporting mechanism that is used to dynamically monitor a particular attribute of a workflow task, data or on the workflow itself. A "probeset" is a grouped set of project probes.

A probe is a combination of three pieces of information that together display a particular status to the user. These are:

1) a task step, or data variable, contained in a flow instance;
2) the value of an attribute of the task step or data variable;
and 3) a display method that takes the value of the attribute as input and displays this value according to the capabilities of the display method.

For example, consider an individual workflow step called Task1. As a step, it has an attribute called the step state. The state attribute always has a value, such as NR, CS, CF, etc. The display method for a state value is a small, color icon that takes a state attribute as input and displays a corresponding color and alphanumeric indicator for that state attribute. Thus, a probe attached to the state attribute of Task1 dynamically reports the value of Task1's state in a visual manner.

Grouping multiple probes together results in a probeset. Any particular probe defined within a probeset may or may not have a relationship to the other probes in the probeset, but they are typically grouped together by the user based on some common context. The ability to place unrelated probes within a probeset monitor provides flexibility for the user to create whatever status view is desired.

For example, the user can define a probeset where each probe references a different step within a single workflow. This probeset provides a report on the progress within that particular flow. Likewise, a probeset can be defined where each probe referenced the same task, only the attribute on that task differs. This type of probeset would provide detailed information on a specific task. Since a probeset allows individual probes to reference different workflows, a probeset could be defined that monitors the state of the same tasks or data in several different workflows simultaneously.

Figure 15:
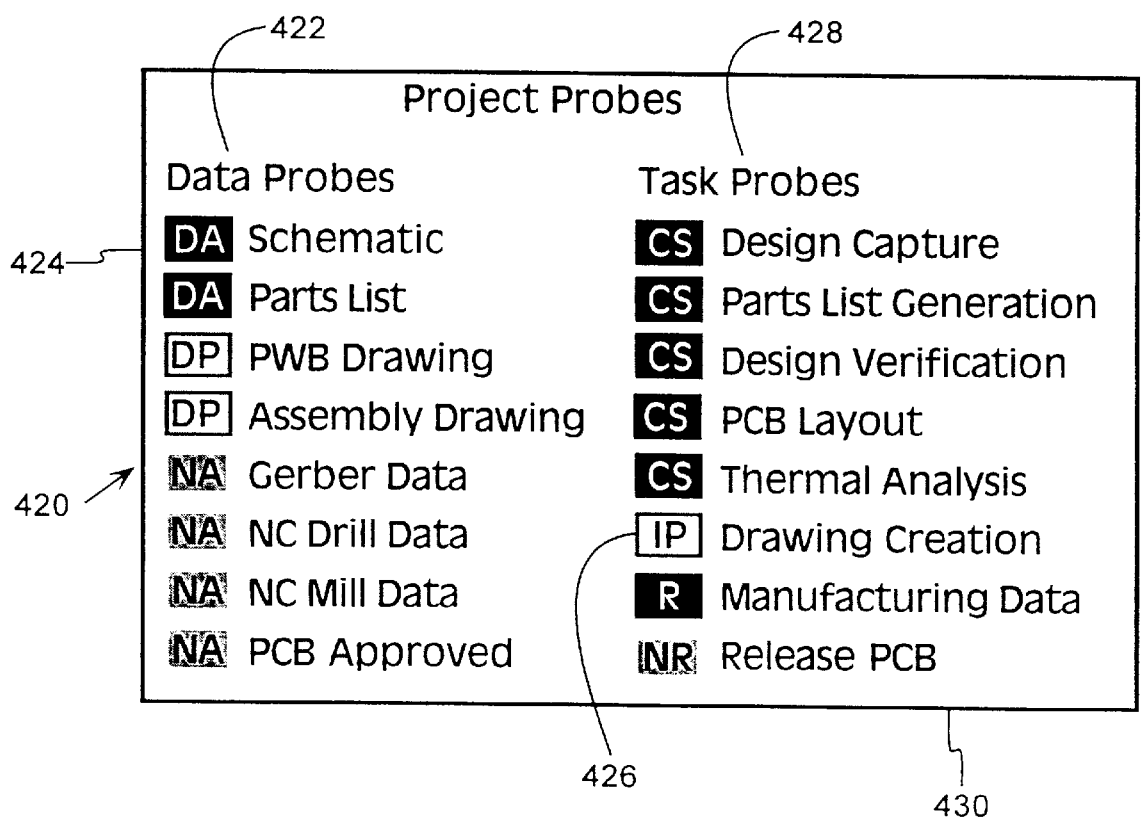
FIG. 15 illustrates an example of project probes in the workflow manager system according to an embodiment of the invention.

FIG. 15 represents an example of a probeset (420) of project probes, as displayed in the workflow manager system. This example includes a number of data probes (422) to graphically represent the state of data. When the state of the underlying data changes, both the text in the boxes (e.g. 424, 426) and the color of the box is dynamically updated to highlight the change in state. Similarly, task probes in the right column (428) graphically represent the state of steps in one or more workflows. Presented in a window (430) of the workflow manager system, the project probes provide a helpful summary of the state of a workflow at various stages in a project.

While we have described in detail an embodiment of the invention, it should be understood that the implementation of the invention can vary.

In view of the many possible embodiments to which the principles of our invention may be put, it is emphasized that the detailed embodiment described herein is illustrative only and should not be taken as limiting the scope of our invention. Rather, we claim as our invention all such embodiments as may come within the scope and spirit of the following claims and equivalents thereto.

We claim:

1. A method for managing a workflow using a programmed computer system, the method comprising:

displaying a graphical user interface for receiving a workflow definition;

receiving the workflow definition from a user including a definition of steps in the workflow, a dependency expression for a step, and a step encapsulation;

associating a step in the workflow with a graphical representation corresponding to the step;

retrieving from memory the workflow definition including the definition of steps in the workflow, and the dependency expression for a step, creating an instance of the workflow definition, and storing the instance such that the instance is accessible to workflow manager programs, each executing on separate nodes of a network;

from each of at least two workflow manager programs executing on separate nodes of a network, retrieving the workflow instance, displaying the same graphical representations of the steps in the instance of the workflow to each user, controlling execution of steps in the workflow by evaluating the dependency expression in the retrieved workflow instance in response to user selection of the graphical representation of the steps, and updating state of steps and data being operated on such that an updated instance and data being operated on is independently accessible to each of the workflow manager programs, the same graphical representations of the updated steps and data in the instance of the workflow are viewable by and operable to receive user input from the users of the workflow manager programs, and updated state of the workflow instance is communicated to each workflow manager program in response to a change in workflow state;

from each of the workflow manager programs, controlling whether a user can begin execution of a step in the workflow based on the dependency expression for the step such that each of the workflow manager programs independently controls execution of steps in the workflow; and in response to user selection of a graphical representation of a step in the workflow, executing the selected step in the workflow, including invoking an application program according to the step encapsulation.

2. The method of claim 1 wherein the dependency expression for a step defines a dependency where a predefined state of a first step is a pre-condition to execution of a second step.

3. The method of claim 2 wherein the dependency expression is a boolean expression having a step state variable corresponding to a step as an operand of the boolean expression.

4. The method of claim 1 wherein the dependency expression for a step describes a dependency where a pre-defined state of work data is a pre-condition to execution of the step.

5. The method of claim 4 wherein the dependency expression for a step is a boolean expression having a work data state variable as an operand to the boolean expression.

6. The method of claim 1 further including the steps of:

maintaining step state data corresponding to a step in the workflow;

updating step state data in response to executing a step;

dynamically communicating the updated step state data to other workflow programs operating on the same instance such that each of the workflow managers display an updated view of the workflow instance; and representing step state data graphically on the graphical representation of the workflow definition when the workflow is displayed.

7. The method of claim 1 further including the steps of:

maintaining state of work data in the workflow;

updating the state of work data in response to executing a step; and dynamically communicating the updated state of work data to other workflow programs operating on the same instance.

8. The method of claim 1 wherein the executing step includes invoking the application program according to the step encapsulation to transform the work data.

9. The method of claim 8 wherein the executing step includes receiving results data from the application program, and updating step state based on the results data from the application program.

10. The method of claim 1 further including:
in response to execution of a step, recording historical data in a history log file in secondary storage of the programmed computer system.

11. The method of claim 1 wherein a step in the workflow is a subflow step including at least one sub-step, and the method further includes:
in response to user input to activate the subflow step, displaying the at least one sub-step through the user interface.

12. The method of claim 1 further including:
storing in memory of the programmed computer system a template of a workflow corresponding to the workflow definition.

13. The method of claim 12 including:
retrieving the template from memory of the programmed computer system;
creating an instance of the template;
changing the state of the instance by executing one or more steps of the workflow; and
storing an updated instance of the workflow.

14. The method of claim 12 including the steps of:
storing more than one template in memory of the computer system;
in response to a first user request, creating an instance of a first template;
in response to a second user request, creating an instance of a second template; and
selectively displaying and executing the instances of the first and second templates.

15. The method of claim 12 further including the steps of:
creating an instance of the template;
controlling access to the instance of the template from a second programmed computer system;
changing the state of the instance by executing one or more steps of the workflow from the second programmed computer system;
and storing an updated instance of the workflow.

16. The method of claim 12 wherein the template is operable for creating a plurality of workflow instances from the template.

17. A computer-readable medium having computer-executable instructions for performing the steps of claim 1.

18. The method of claim 1 wherein the workflow is for designing an electronic circuit.

19. A method for managing workflow using a programmed computer system, the method comprising:
displaying a graphical user interface for receiving a workflow definition;
receiving the workflow definition from a user including a definition of steps in the workflow, a dependency relationship between steps, and a description of a step encapsulation;
associating a step in the workflow with a graphical representation of the step;
retrieving from memory the workflow definition including the definition of steps in the workflow, and a dependency expression for a step, creating an instance of the workflow definition, and storing the instance such that the instance is accessible to a group of users; from each of at least two workflow manager programs executing on separate nodes of a network, retrieving the workflow instance, displaying graphical representations of the steps in the instance of the workflow, controlling execution of steps in the workflow based on the dependency relationship in the retrieved instance in response to user selection of the graphical representation of the steps, and updating state of steps and data being operated on such that an updated instance and data being operated on is independently accessible to each of the workflow manager programs and each of the graphical representations of the steps in the instance of the workflow are viewable by and operable to receive user input from users of the workflow manager programs;
in response to a user selection in the graphical representation in each of the workflow manager programs, controlling execution of a step in the workflow including controlling whether a step may be executed based on the dependency relationship in the instance such that each of the workflow manager programs independently controls execution of steps in the workflow;
in response to executing the step, updating state data corresponding to the step; and
graphically depicting the state of a step in the workflow.

20. The method of claim 19 wherein each of the workflow manager programs operating on the workflow instance display the same graphical representation of each of the steps in the instance, and each of the workflow manager programs dynamically update the state of the steps in the workflow such that each of the workflow managers operating on the same instance display the same updated graphical representations of the steps in the instance.

21. A computer readable medium having instructions for performing the steps of claim 19.

22. A programmed computer system for managing a workflow comprising:
a flow instance data store for storing a definition of a workflow including dependency relationships among steps in the workflow and for storing step and data state variables for steps in the workflow;
a flow display for displaying graphical representations of the steps in the instance of the workflow on a display screen of the programmed computer system and for receiving a step selection from a user;
a flow manager in communication with the flow instance data store and the flow display for retrieving the workflow instance, for executing steps in the workflow in response to user selection of the graphical representation of the steps, for controlling execution of steps in the workflow in response to the step selection, for updating the step and data state variables for the steps in the workflow, for instructing the flow display to update the graphical representation of the workflow, and for dynamically updating state of steps and data being operated on such that an updated instance and data being operated on is independently accessible to other flow managers, each of the graphical representations of the steps in the instance of the workflow are viewable by and operable to receive user input from users of the flow managers, and updates are dynamically communicated to other flow managers so that each flow manager operating on the instance displays the same dynamically updated graphical representation of the steps in the instance;
and a communication mechanism in communication with the flow manager for transferring commands to execute step encapsulations for the steps.

23. A computer assisted method for managing a workflow, the method comprising:

storing a workflow instance in a flow instance database, the workflow instance including steps, dependencies among the steps, and actions for the steps;

from each of at least two workflow manager programs executing on separate nodes of a network, retrieving the workflow instance, displaying graphical representations of the steps in the instance of the workflow, controlling execution of steps in the workflow based on the dependency among the steps in the retrieved workflow instance in response to user selection of the graphical representation of the steps, and updating state of steps and data being operated on such that an updated instance and data being operated on is independently accessible to each of the workflow manager programs and each of the graphical representations of the steps in the instance of the workflow are viewable by and operable to receive user input from users of the workflow manager programs;

receiving a user selection of the graphical representation of a step;

in response to the user selection in each of the workflow manager programs, checking a dependency for the selected step in the workflow instance retrieved by the workflow manager program to determine whether the dependency is satisfied, and if so, executing the selected step such that each of the workflow manager programs independently controls execution of steps in the workflow;

in response to execution of a selected step, updating a step state variable for the selected step, and updating a data state variable; and storing the step state variable and the data state variable in the flow instance database.

24. The method of claim 23 further including:

controlling concurrent access to the flow instance database so that multiple users can have access to a workflow instance file in the flow instance database.

25. The method of claim 23 wherein the workflow instance includes a subflow step having an associated subflow; the method further including:

in response to a user request to execute the subflow step, performing the associated subflow.

26. The method of claim 23 wherein the workflow instance includes a subflow step having more than one associated subflows; the method further including:

in response to a request to execute a subflow step: selecting one of the more than one associated subflows, binding the selected associated subflow to the subflow step, and performing the selected subflow step.

27. The method of claim 23 further including:

storing a dynamic link between one or more pre-selected step state variables and associated project probes; and displaying on a display screen a graphic representation of the project probes.

28. The method of claim 23 further including:

storing a dynamic link between one or more pre-selected data state variables and associated project probes; and displaying on a display screen a graphic representation of the project probes.

29. The method of claim 23 wherein an action for a step identifies a step encapsulation; the method further including:

in response to a request to execute the step, executing the step encapsulation identified for the step.

30. The method of claim 29 wherein the action for the step identifies more than one step encapsulations; the method further including:

in response to the request to execute the step, selecting one of the more than one step encapsulations, binding the selected step encapsulation to the step, and executing the selected step encapsulation.

31. The method of claim 23 wherein each of the workflow manager programs operating on the workflow instance display the same graphical representation of each of the steps in the instance, and each of the workflow manager programs dynamically update the state of the steps in the workflow such that each of the workflow managers operating on the same instance display the same updated graphical representations of the steps in the instance.

32. A computer readable medium having instructions for performing the steps of claim 23.

33. A method for managing a workflow using a programmed computer system, the method comprising:

retrieving from memory a workflow definition including a definition of steps in a workflow, and a dependency expression for a step, creating an instance of the workflow definition, and storing the instance such that the instance is accessible to a group of users;

from each of at least two workflow manager programs executing on separate nodes of a network, retrieving the workflow instance, displaying graphical representations of the steps in the instance of the workflow, controlling execution of steps in the workflow in response to user selection of the graphical representation of the steps, and updating state of steps and data being operated on by the workflow manager programs such that an updated instance and data being operated on is independently accessible to each of the workflow manager programs and the graphical representations of the steps in the instance of the workflow are viewable by and operable to receive user input from users of the workflow manager programs;

in each of the workflow manager programs, controlling whether a user can begin execution of a step in the instance of the workflow based on the dependency expression for the step in the retrieved instance of the workflow such that each of the workflow manager programs independently control execution of the workflow; and in response to a user selection associated with a step in the graphical representation of the instance, invoking an application program according to a step encapsulation.

34. A computer readable medium on which is stored a computer program for managing a workflow, said program comprising instructions, which when executed by a computer, perform the method steps of claim 33.

35. The method of claim 33 wherein each of the workflow manager programs operating on the workflow instance display the same graphical representation of each of the steps in the instance, and each of the workflow manager programs dynamically update the state of the steps in the workflow such that each of the workflow managers operating on the same instance display the same updated graphical representations of the steps in the instance.

* * * * *